(12) United States Patent
Mokhlesi et al.

(10) Patent No.: US 6,850,441 B2
(45) Date of Patent: Feb. 1, 2005

(54) NOISE REDUCTION TECHNIQUE FOR TRANSISTORS AND SMALL DEVICES UTILIZING AN EPISODIC AGITATION

(75) Inventors: Nima Mokhlesi, Los Gatos, CA (US); Daniel C. Guterman, Fremont, CA (US); Geoffrey S. Gongwer, Los Altos, CA (US)

(73) Assignee: SanDisk Corporation, Sunnyvale, CA (US)

( * ) Notice: Subject to any disclaimer, the term of this patent is extended or adjusted under 35 U.S.C. 154(b) by 16 days.

(21) Appl. No.: 10/052,924

(22) Filed: Jan. 18, 2002

(65) Prior Publication Data

US 2003/0137877 A1 Jul. 24, 2003

(51) Int. Cl.[7] .............................................. G11C 16/04
(52) U.S. Cl. ............................ 365/185.19; 365/185.21; 365/185.09
(58) Field of Search ........................ 365/185.19, 185.21, 365/185.09, 185.01

(56) References Cited

U.S. PATENT DOCUMENTS

| | | | | |
|---|---|---|---|---|
| 4,279,024 A | * | 7/1981 | Schrenk | ................. 365/185.22 |
| 4,630,086 A | | 12/1986 | Sato et al. | |
| 5,068,827 A | * | 11/1991 | Yamada et al. | ........ 365/185.19 |
| 5,172,338 A | | 12/1992 | Mehrotra et al. | |
| 5,172,338 A | | 12/1992 | Mehrotra et al. | |
| 5,418,752 A | | 5/1995 | Harari et al. | |
| 5,712,180 A | | 1/1998 | Guterman et al. | |
| 5,748,533 A | * | 5/1998 | Dunlap et al. | ......... 365/185.19 |
| 5,768,192 A | | 6/1998 | Eitan | |
| 5,892,706 A | | 4/1999 | Shimizu et al. | |
| 6,044,019 A | | 3/2000 | Cernea et al. | |
| 6,103,573 A | | 8/2000 | Harari et al. | |
| 6,222,762 B1 | | 4/2001 | Guterman et al. | |
| 6,275,417 B1 | * | 8/2001 | Lee et al. | .............. 365/185.19 |

FOREIGN PATENT DOCUMENTS

| | | |
|---|---|---|
| WO | WO 95/19047 | 7/1995 |
| WO | WO 01/27931 A1 | 4/2001 |

OTHER PUBLICATIONS

Bauza et al., "In–Depth Exploration of Si–SiO$_2$ Interface Traps in MOS Transistors Using the Charge Pumping Technique," *IEEE Transactions on Electron Devices*, vol. 44, No. 12, Dec. 1997, pp. 2262–2266.

Bloom, et al., "1/f Noise Reduction of Metal–Oxide–Semiconductor Transistors by Cycling from Inversion to Accumulation," *Appl. Phys. Lett.* 58 (15), Apr. 15, 1991, pp. 1664–1666.

(List continued on next page.)

*Primary Examiner*—Huan Hoang
(74) *Attorney, Agent, or Firm*—Parsons Hsue & de Runtz LLP

(57) ABSTRACT

The present invention presents methods for reducing the amount of noise inherent in the reading of a non-volatile storage device by applying an episodic agitation (e.g. a time varying voltage) to some terminal(s) of the cell as part of the reading process. Various aspects of the present invention also extend to devices beyond non-volatile memories. According to one aspect of the present invention, in addition to the normal voltage levels applied to the cell as part of the reading process, a time varying voltage is applied to the cell. A set of exemplary embodiments apply a single or multiple set of alternating voltages to one or more terminals of a floating gate memory cell just prior to or during the signal integration time of a read process. In other embodiments, other reproducible external or internal agitations which are repeatable, and whose average effect (from one integration time to the next integration time) remains sufficiently constant so as to have a net noise reduction effect is applicable.

70 Claims, 9 Drawing Sheets

OTHER PUBLICATIONS

Dierickx e tal., "The Decrease of "Random Telegraph Signal" Noise in Metal–Oxide–Semiconductor Field–Effect Transistors When Cycled from Inversion to Accumulation," *J. Appl. Phys.* 71 (4), Feb. 15, 1992.

Hung et al., "Random Telegraph Noise of Deep–Submicrometer MOSFET's," *IEEE Electron Device Letters*, vol. 11 No. 2, Feb. 1990, pp. 90–92.

Hung et al., "A Unified Model for the Flicker Noise in Metal–Oxide–Semiconductor Field–Effect Transistors," *IEEE Transactions on Electron Devices*, vol. 37, No. 3, Mar. 1990, pp. 654–665.

Fleetwood et al., "Effects of Oxide Traps, Interface Traps, and Border Traps on Metal–Oxide–Semiconductor Devices," *J. Appl. Phys.*, vol. 73, No. 10, May 15, 1993, pp. 5058–5075.

Iafrate et al., "Capacitive Nature of Atomic–Sized Structures," *Physical Review B*, vol. 52, No. 15, Oct. 15, 1995–I, pp. 10–737—10–739.

Jallepalli et al., "Electron and Hole Quantization and Their Impact on Deep Submicron Silicon p– and n– MOSFET Characteristics," *IEEE Transactions on Electron Devices*, vol. 44, No. 2, Feb. 1997, pp. 297–303.

Klumperink et al., "Reducing MOSFET 1/f Noise and Power Consumption by Switched Biasing," *IEEE Journal of Solid–State Circuits*, vol. 35, No. 7, Jul. 2000, pp. 994–1001.

Korotkov, "Intrinsic Noise of the Single–Electron Transistor," *Physical Review B*, vol. 49, No. 15, Apr. 15, 1994, pp. 10 381—10 392.

Kumar et al., "1/f Noise Model of Fully Overlapped Lightly Doped Drain MOSFET," *IEEE Transactions on Electron Devices*, vol. 47, No. 7, Jul. 2000, pp. 1426–1430.

Ma et al., "New Insight into High–Field Mobility Enhancement of Nitrided–Oxide N–MOSFET's Based on Noise Measurement," *IEEE Transactions on Electron Devices*, vol. 41, No. 11, Nov. 1994, pp. 2205–2209.

Mokhlesi et al., "A Solution for Current–Volate Characteristics of Multiple Coupled Mesoscopic Tunnel Junctions," *Superlattices and Microstructures*, vol. 21, No. 1, 1997, pp. 15–19.

Nemirovsky et al., "I/f Noise in CMOS Transistors for Analog Application," *IEEE Transaction on Electron Devices*, Col. 48, No. 5, May 2001, pp. 921–927.

Ohjuro et al., "An Epitaxial Channel MOSFET for Improving Flicker Noise Under Low Supply Voltage," *2000 Symposium on VLSI Technology Digest of Technical Papers*, pp. 160–161.

Pacelli et al., "Quantum Effects on the Extraction of MOS Oxide Traps by 1/f Noise Measurments," *IEEE Transactions on Electron Devices*, vol. 46, No. 5, May 1999, pp. 1029–1035.

Pohm, A.V., et al., "The Design of a One Megabit Non–Volatile M–R Memory Chip Using 1.5*5 mu m Cells," IEEE Transactions on Magnetics, vol. 24, No. 6, Nov. 1988, pp. 3117–3119.

Surya et al., "Effects of Low–Energy Back Surface Gettering on the Properties of 1/f Noise in n–Channel Nitrided MOSFETs," *ICSE '96 Proc.*, Nov. 1996, Penang, Malaysia, pp. 59–62.

Vandamme et al., "Critical Discussion on Unified 1/f Noise Models for MOSFETS," *IEEE Transactions on Electron Devices*, vol. 47, No. 11, Nov. 2000, pp. 2146–2152.

van der Wel et al., "MOSFET 1/f Noise Measurement Under Switched Bias Conditions," *IEEE Electron Device Letters*, vol. 21, No. 1, Jan. 2000, pp. 43–46.

Ma, "A Dual–Bit Split–Gate EPPROM (DSG) Cell in Contactless Array for Single–Vcc High Density Flash Memories," *Technical Digest*, Electron Device Meeting, 1994, pp. 3.5.1—3.5.4.

International Search Report mailed Oct. 10, 2003.

* cited by examiner

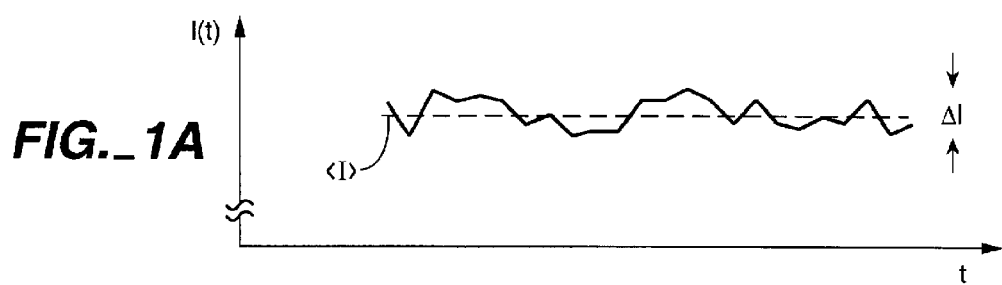
FIG._1A
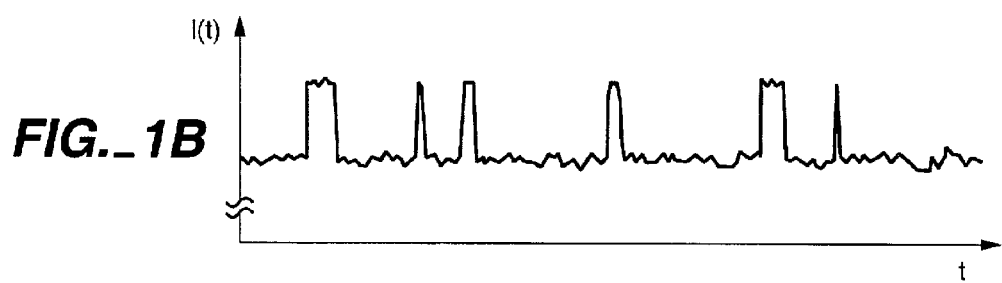
FIG._1B
FIG._1C
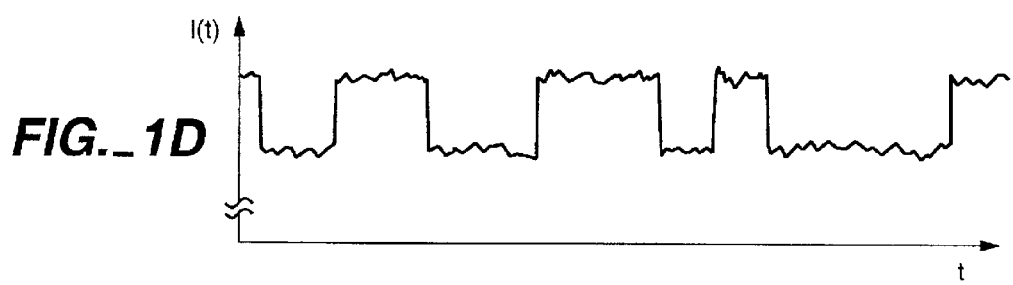
FIG._1D

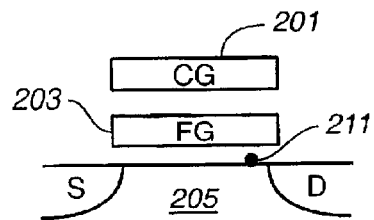
FIG._2A
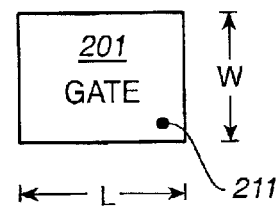
FIG._2B
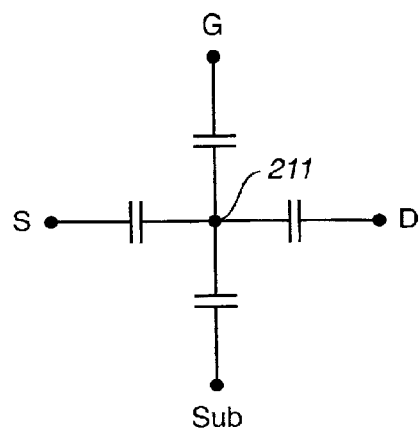
FIG._2C
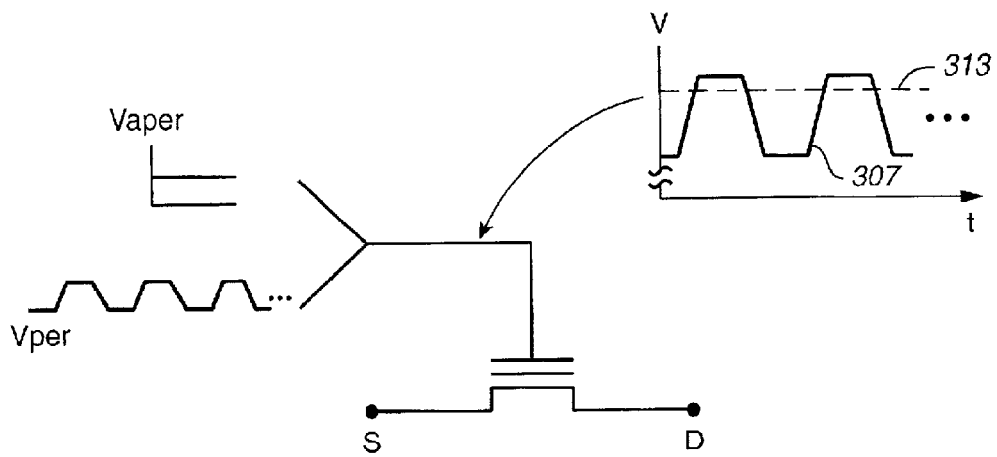
FIG._3

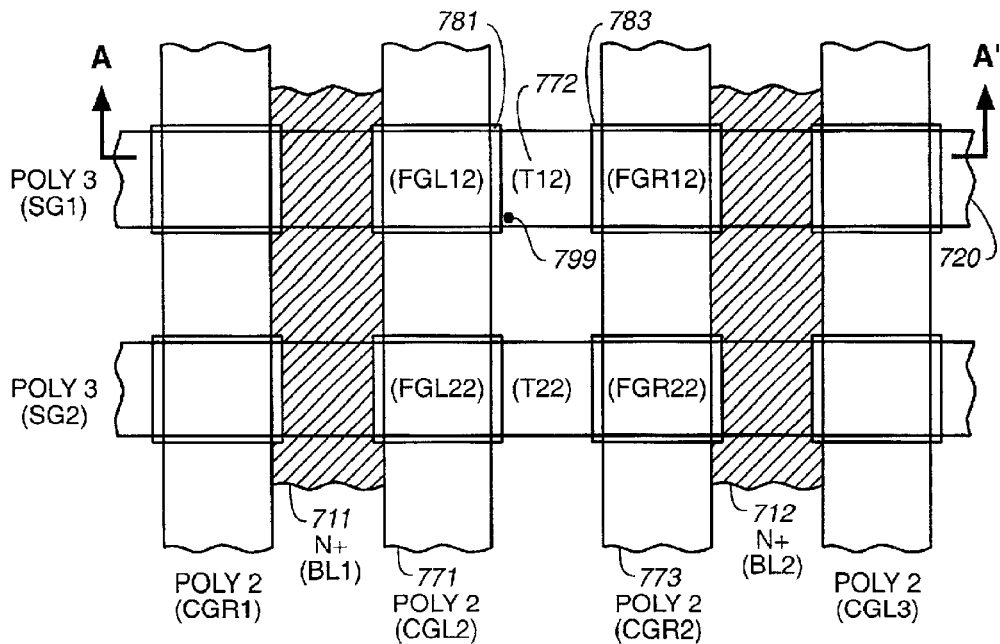
FIG._4A
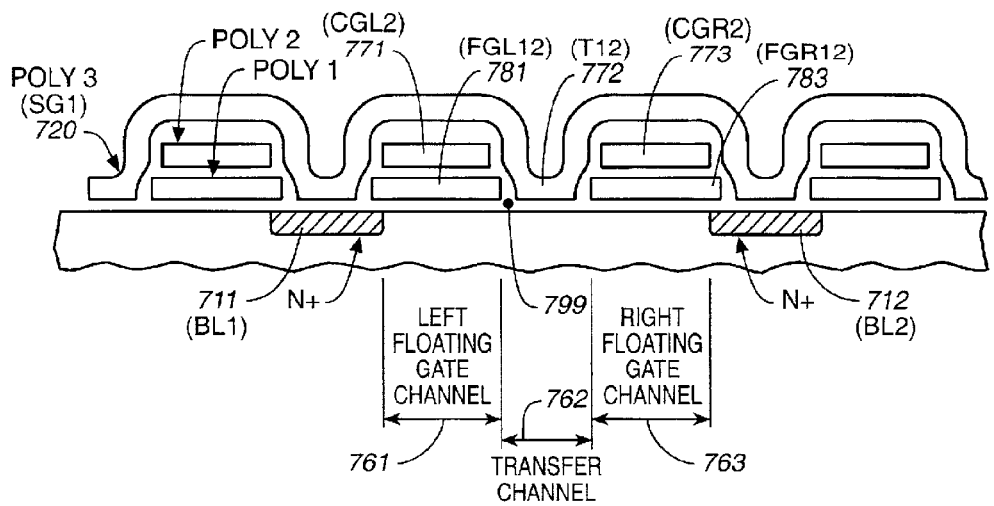
FIG._4B

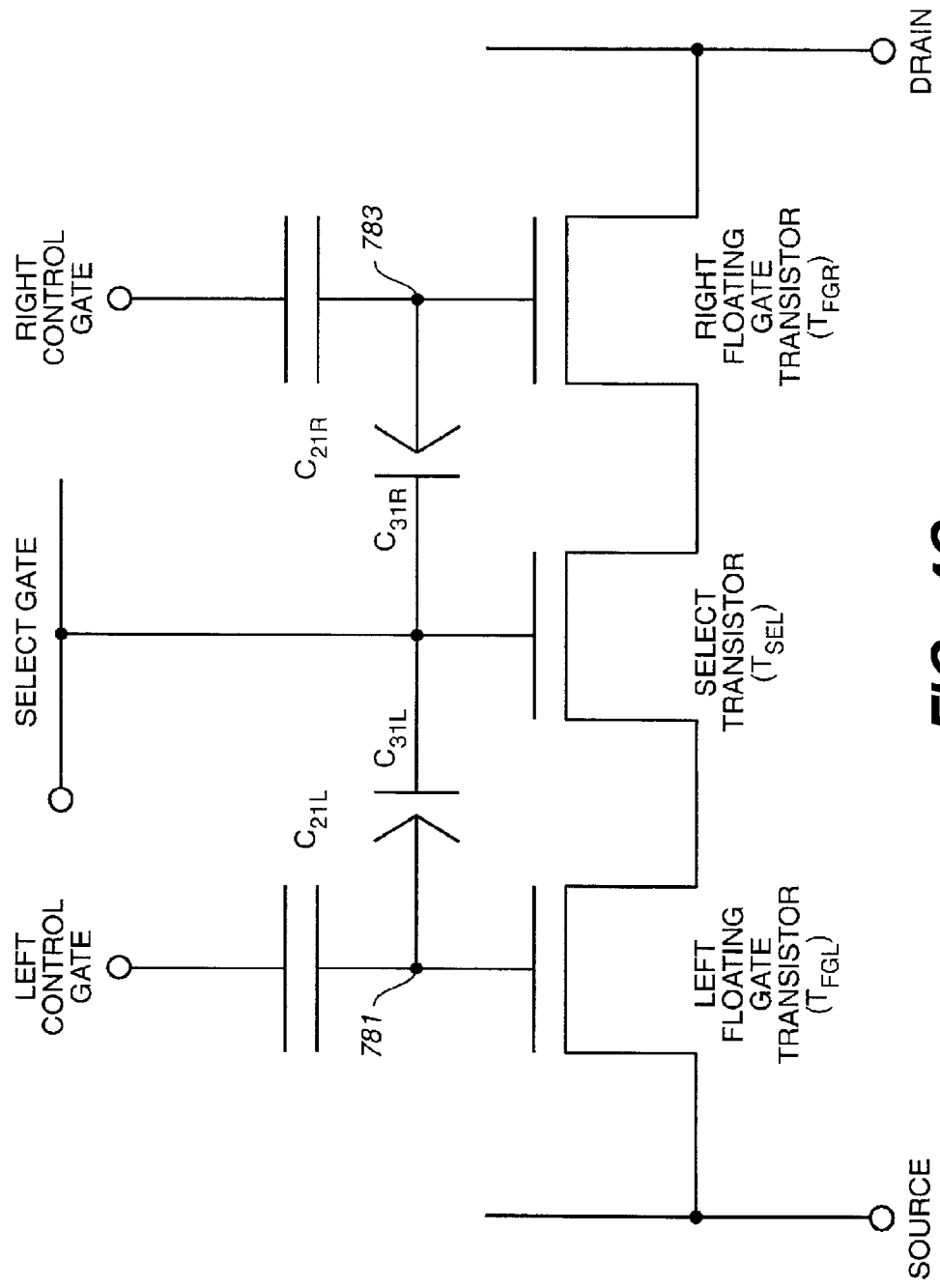
FIG._4C

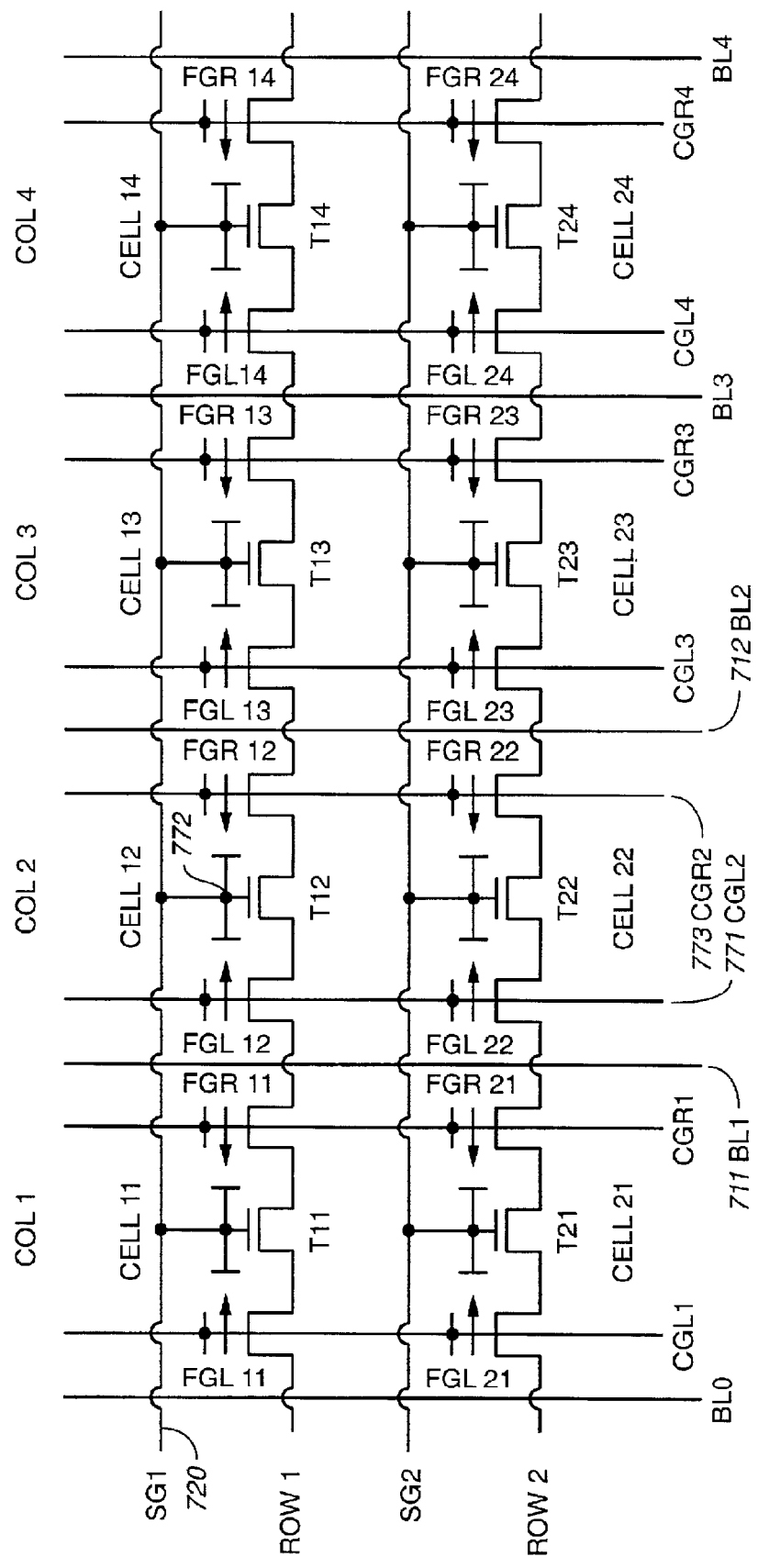
FIG._4D

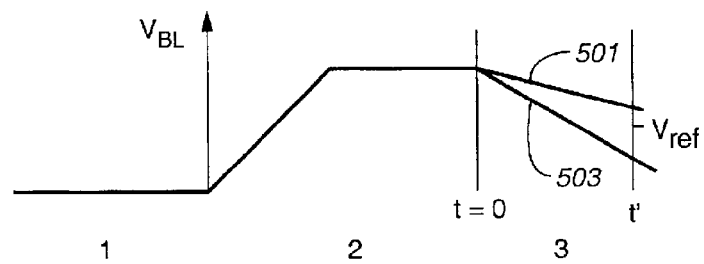
FIG._5A
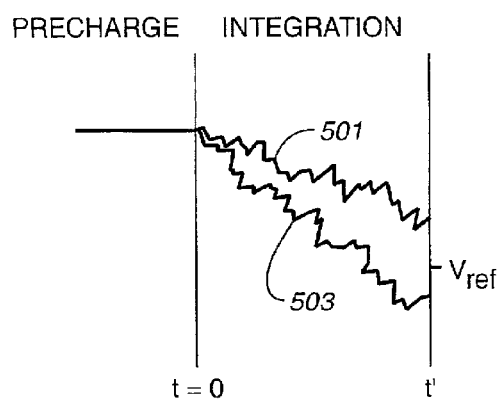 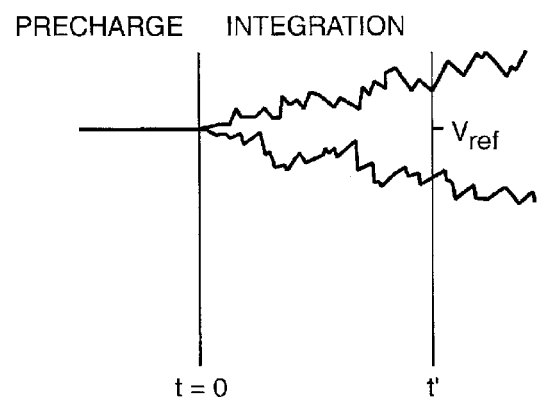
FIG._5B  FIG._5C

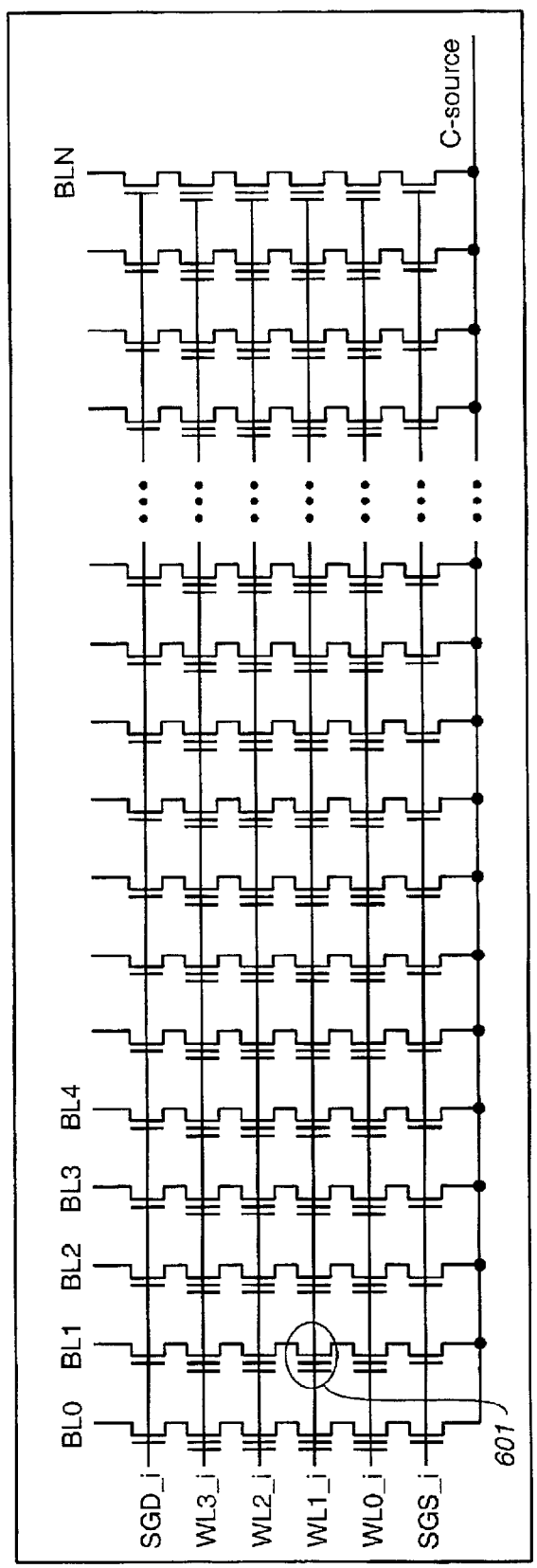
FIG._6

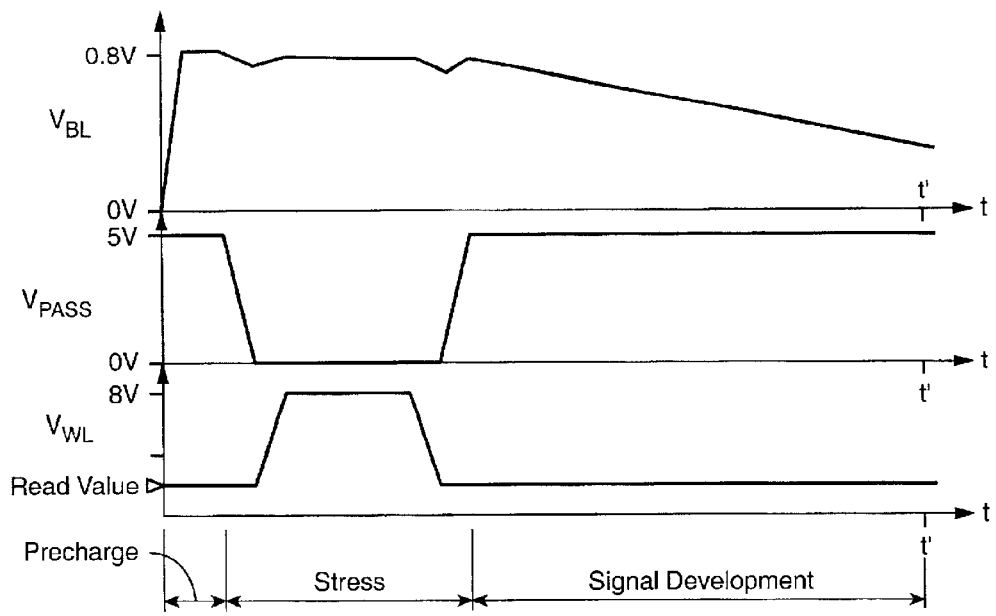
FIG._7A
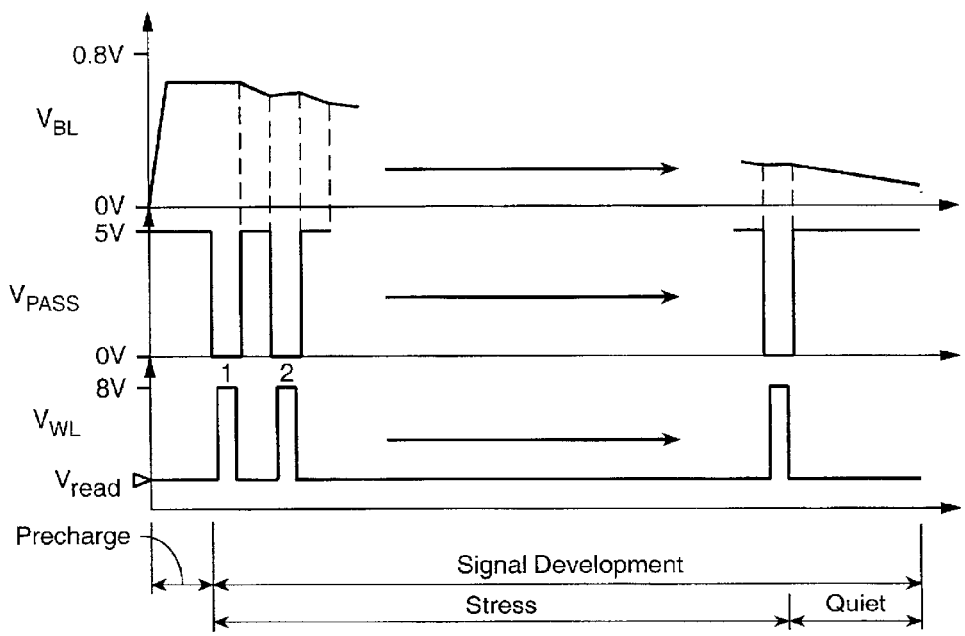
FIG._7B

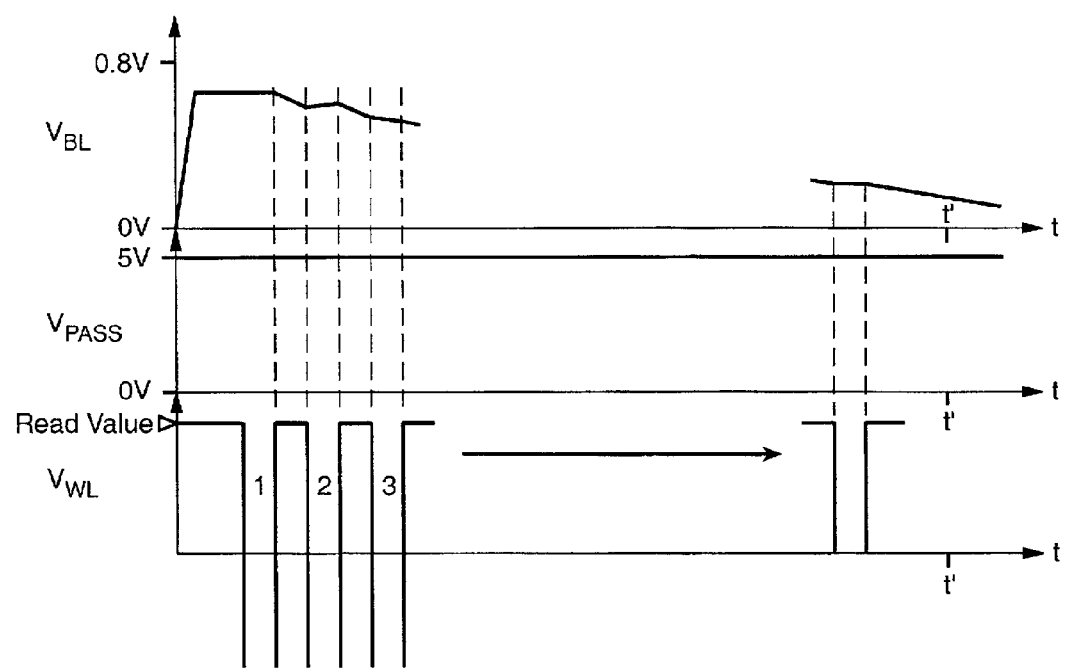
FIG._7C

NOISE REDUCTION TECHNIQUE FOR TRANSISTORS AND SMALL DEVICES UTILIZING AN EPISODIC AGITATION

BACKGROUND OF THE INVENTION

1. Field of the Invention

This invention relates generally to transistors and small electronic devices including computer readable memory devices which can be read both statically, as found in-static RAM sensing schemes, or dynamically, as in dynamic RAMs which use precharge followed by signal development, and, more specifically, to methods for reducing noise when reading their information content.

2. Background Information

In non-volatile semiconductor memories, such as an EEPROM or Flash memory, the amount of data stored per memory cell has been increased in order to increase storage densities. At the same time, the operating voltages of such devices have decreased to reduce power consumption. This results in a greater number states stored in a smaller range of voltage or current values. As the voltage or current separation between data states decreases, the effects of noise become more important in the reading of these cells. For example, variations in the threshold value that are acceptable in a binary storage EEPROM cell operating at 5 volts may no longer be acceptable in a device operating at 3 volts with four or more bits storable per cell. Some consequences of noise, and methods for dealing with it, in a non-volatile memory are described in U.S. Pat. No. 6,044,019, which is hereby incorporated by reference.

Traditionally, physically larger transistors have been used for sensitive analog application, whereas digital circuits using physically small digital transistors operating in a binary mode have not been sensitive to the existing low levels of noise. Even 4 level storage non-volatile memories (2 bits/cell) have had large enough sensing margins to be generally immune to this noise in the majority of instances. However, as the scale of memory devices has continued to shrink, non-macroscopic effects, such as single electron or quantum effects, have become increasingly important and have exacerbated the noise problem.

Various aspects of the operation of such small scale devices are discussed in the following references, which are all hereby incorporated by reference:

[1] "Random Telegraph Noise in Deep-Submicrometer MOSFETS" by K. K. Huang, et. al., *IEEE Electron Device Letters*, Vol. 11, No. 2, February 1990;

[2] "Effects of oxide traps, interface traps, and border traps on metal-oxide-semiconductor devices" by D. M. Fleetwood, et. al., *J. Appl. Phys.*, Vol. 73, No. 10, 15 May 1993;

[3] "Quantum Effects on the Extraction of MOS Oxide Traps by 1/f Noise Measurements" by Andrea Pacelli, et. al., *IEEE Transactions on Electron Devices*, Vol. 46, No. 5, May 1999, p. 1029ff;

[4] "In Depth Exploration of Si—$SiO_2$ Interface Traps in MOS Transistors Using the Charge Pumping Technique" by Daniel Bauza, et. al., *IEEE Transactions on Electron Devices*, Vol. 44, No. 12, December 1997, p. 2262ff;

[5] "Critical Discussion on Unified 1/f Noise Models for MOSFETs" by Ewout P. Vandamme, et. al., *IEEE Transactions on Electron Devices*, Vol. 47, No. 11, November 2000, p. 2146ff;

[6] "A Solution for Current-Voltage Characteristics of Multiple Coupled Mesoscopic Tunnel Junctions", by N. Mokhlesi et al., *Superlattices and Microstructures*, vol. 21, no. 1, pp.15–19 (1997);

[7] "Capacitive nature of atomic-sized structures", by G. J. Iafrate et al., *Physical Review B* VOL. 52, Number 15, pp. 10 733, Oct. 15, 1995-I;

[8] "1/f noise reduction of metal-oxide-semiconductor transistors by cycling from inversion to accumulation", by I. Bloom, et al., *Applied Physics Letters* 58(15) 15 Apr. 15, 1991;

[9] "The decrease of "random telegraph signal" noise in metal-oxide-semiconductor field effect transistors when cycled from inversion to accumulation", by B. Dierickx, et al., *Journal of Applied Physics*, 71 (4), Feb. 15, 1992;

[10] "MOSFET 1/f Noise Measurement Under Switched Bias Conditions", by A. P. van der Wel, et al., *IEEE Electron Device Letters*, Vol. 21, No. 1 January 2000;

[11] "Reducing MOSFET 1/f Noise and Power Consumption by Switched Biasing", by Eric A. M. Klumperink, et al., IEEE Journal of Solid-State Circuits, Vol. 35, No. 7, July 2000, although no specific practical noise reduction technique for use in memory systems has been presented in these papers.

Although the consequences of noise can be decreased by techniques such as those in U.S. Pat. No. 6,044,019 incorporated by reference above, or treated, with error correction code (ECC) or other equivalent error management such as is described in U.S. Pat. No. 5,418,752 which is hereby incorporated herein by this reference, memories could benefit from methods to reduce noise arising in the mesoscopic region between the macro- and microscopic ranges.

SUMMARY OF THE INVENTION

The present invention presents methods for further reducing the amount of noise inherent in the reading of a non-volatile storage device by applying an episodic agitation (e.g. a time varying voltage) to some terminal(s) of the cell as part of the reading process. According to one aspect of the present invention, in addition to the normal voltage levels applied to the cell as part of the reading process, a time varying voltage is applied to the cell. A set of exemplary embodiments apply a single or multiple set of alternating voltages to one or more terminals of a floating gate memory cell just prior to or during the signal integration time of a read process. In other embodiments, any other reproducible external or internal agitation which is repeatable, and whose average effect (from one integration time to the next integration time) remains sufficiently constant so as to have a net noise reduction effect is applicable. Other agitating stimuli that may have a net noise reduction effect include externally or internally produced photons, phonons, and magnetic fields.

Additional aspects, features and advantages of the present invention are included in the following description of specific representative embodiments, which description should be taken in conjunction with the accompanying drawings.

BRIEF DESCRIPTION OF THE DRAWINGS

FIGS. 1A–D show examples of noisy response in measured current of a memory cell.

FIGS. 2A–C are schematic representations of an interface state trap in a floating gate memory cell.

FIG. 3 shows one simplified embodiment of the present invention.

FIGS. 4A–D show a particular embodiment of a memory cell structure.

FIGS. 5A–C is a depiction of two particular read processes.

FIG. 6 shows another embodiment of a memory cell structure.

FIGS. 7A–C is a depiction of read processes for the structure of FIG. 6.

DESCRIPTION OF REPRESENTATIVE EMBODIMENTS

The storage capacity of non-volatile semiconductor memories has increased both by the reduction in the physical size of the individual components of the circuits including the memory cell and by increasing the amount of data storable in an individual memory cell. For example, devices such as those described in U.S. Pat. Nos. 5,712,180 and 6,103,573 and U.S. patent application Ser. No. 09/505,555, filed on Feb. 17, 2000, and Ser. No. 09/667,344 filed on Sep. 22, 2000, which are all assigned to SanDisk Corporation and which are all hereby incorporated herein by this reference, can store four or more logical bits per physical floating gate storage transistor. In the case of 4 logical bits this storage will require each floating gate to be able to have encoded within it one of sixteen possible memory states. Each one of these memory states corresponds to a unique value, or, more accurately, a narrow range of values, of stored charge on the floating gate which is sufficiently separated from its neighboring states' charge storage range of values to clearly differentiate it from those neighboring states as well as all the other states. This is true for both a normal read operation as well as for a verify read done as part of a programming operation.

A number of techniques for reading memory cells are described in U.S. patent application Ser. No. 09/671,793, filed on Sep. 27, 2000, and one entitled "Sense Amplifier for Multilevel Non-Volatile Integrated Memory Devices" by Shahzad Khalid, filed on Nov. 20, 2001, which are assigned to SanDisk Corporation and which are both hereby incorporated herein by this reference. The first of these applications describes reading the content of the memory cell with 7-bit or higher resolution for use in 4-bit storage. When this number of levels is contained in a 3 volt window of operating voltages as is found on low voltage devices, this results in approximately a 25 mV resolving capability requirement and a 200 mV state to state separation. With this range, levels of noise formerly acceptable can now lead to the state of the cell being read with an error of one or more state levels.

FIGS. 1A–D illustrate examples of noise fluctuations in the reading of a memory cell. FIG. 1A shows the case where the value of some parameter indicative of the state of the memory cell, in this case the current I(t) fluctuates around some mean value <I>. In this case, if the signal development time is several times longer than the typical time scale of the fluctuations, then a relatively noise-free value for the state of the cell can be determined. The signal development time is the time interval over which the measurable indicating the state of the cell is being developed. The measurable can be the cell drive current value, the cell threshold voltage, the bit line voltage drop generated in a fixed amount of time, or the amount of time required to generate a fixed amount of bit line voltage drop. Some methods for determining a relatively accurate value for the state of the cell are described in U.S. Pat. No. 6,044,019, from which FIG. 1A is adapted and which was incorporated by reference above.

Additional read techniques that can be further combined with these other techniques is described in a co-pending U.S. patent entitled "Reducing the Effects of Noise in Non-Volatile Memories Through Multiple Reads" by Carlos J. Gonzalez and Daniel C. Guterman, filed concurrently with the present application and which is hereby incorporated by reference. As these other techniques can deal with components of noise having different characteristics, they should be considered complementary to each other and to the present invention.

In some instances, it has been found that the noise is not normally distributed in magnitude around a single mean, but appears to have a bimodal characteristic, such as shown in FIGS. 1B, 1C, and 1D and discussed in reference [1] cited in the Background section. FIGS. 1B and 1C show the example of the measured current from a memory cell where the current fluctuates around a value of, for example, 1 $\mu$A, but with a number of approximately equal magnitude spikes of, for example, 0.10 $\mu$A. In FIG. 1B the spikes are at a higher current from a base value, in FIG. 1C the spikes are at a lower current, and in FIG. 1D the higher and lower conduction levels dictated by the noise source have comparable time characteristics. In all three cases their durations vary randomly. Both during the time of the spikes and in the time between them, there exists additional noise of the type seen in FIG. 1A. As the scale of memory devices has continued to shrink, non-macroscopic effects, such as single electron or quantum effects, have become increasingly important and have exacerbated noise problems by the introduction of these momentary spikes that arise in the mesoscopic region. The magnitude and the range of durations of the spikes will depend upon the particular mechanism that produce them.

If the lifetime of the spikes is short enough when compared to the integration period (i.e. signal development time) of the reading process such as described in U.S. Pat. No. 6,044,019, or if the spikes are frequent enough such that statistically roughly the same number of noise spikes are presented during each integration period, then the time averaging effect of the integration time can be such that the impact of the noise becomes negligible. However, it has been found that in some cases a memory cell can have noise with characteristic time constants that are comparable to or substantially longer than times that practical integration periods can span. In this situation, the noise can have an unacceptably large influence on the resulting sensing. For example, referring to FIG. 1D, if the integration period is comparable to or smaller than the typical time a noise event is manifest (e.g. resulting in a higher current), then there will typically be two different sensed values, depending on when in time the sensing takes place. This can severely limit the resolution with which the data content of the cell can be read.

For example, consider a class of applications in the context of Flash memory cells. In observing transistor noise on transistors of various sizes and types (both Flash cells of different generations and NMOS transistors), it has been observed (see, for example, reference [1] of the Background) that the magnitude of noise is inversely related to transistor width, and may also be similarly related to transistor length, so that noise increases with transistor scaling. The threshold voltage, $V_{TH}$, of a transistor can be read a number of times, and by measuring the various values of $V_{TH}$ each time the measurement is made, the consequence of transistor noise can be studied. To measure the $V_{TH}$ using a semiconductor parameter analyzer, the gate/control gate voltage, $V_G$, can be swept to search for that value of $V_G$ which results in a pre-designated amount of drain to source current (for example 1 $\mu$A). When the $V_{TH}$ measurement is repeated many times, slightly different values of $V_{TH}$ from each measurement are found. It is also observed that using longer integration times and/or sweeping $V_G$ with smaller increments does not necessarily or appreciably reduce the noise. Alternatively, fixed voltages can be applied to all transistor terminals, to make numerous (e.g. thousands) of repetitive DC current measurements. Overall, the current remains roughly constant. However, when observed on a fine resolution scale, variations are detected that are often unacceptable levels of noise in both analog devices and multi-level non-volatile memory cells, especially where the number of storage levels are 8 or higher (i.e. three or more bits per cell). A fraction of memory cells within a memory array are found to be noise-free. This is a consequence of the noise source population in a large sample of device measurements, which tend to follow a normal distribution with a characteristic standard deviation. In a device with behavior such as shown in FIGS. 1B and 1C, the transistors will exhibit noise that is normally distributed plus some current values that fall out of the normal distribution corresponding to the narrow noise spikes; and in a device with behavior such as shown in FIG. 1D, the noise will have a distribution that is more bimodal than normal. Many transistors are relatively noise free at some current values (corresponding to a particular gate voltage value), and noisier at other current values. Some transistors are noisy at most current values.

In the example of a Flash cell, at least one source of this noise could be interface state traps, IST. Although the methods of the present invention can be applied to reduce noise from many sources in many different systems, the IST case will be discussed in some detail in order to show how these methods can reduce noise arising from one particular mechanism.

Based on the naming convention adopted in much of the prior art (see, for example reference [2] of the Background), the term interface state traps is being used loosely. Strictly speaking, what is here referred to as interface states include not just interface states located right at the interface of $Si/SiO_2$, but also border traps that reside in the oxide and are within 30 Å to 40 Å of the interface. Electrically, both border states, and interface states (by the strict nomenclature) are switching states, whereas deep oxide traps are fixed states. Switching states can at times be occupied by an electron and at other times be empty, whereas fixed states have a tendency to retain their state over long periods of time at normal operating temperatures. In standard CMOS processing, and in processing of an EEPROM cell, it is typical to subject the wafer to a hydrogen anneal process. As a result of the Hydrogen anneal process, the density of interface state traps at the interface between the substrate and the floating gate oxide can typically be reduced to as low as $1 \times 10^{10}$ cm$^2$/eV. As the band gap of Silicon is roughly 1 eV, this state of the art low value of density of interface state traps (ISTs) equates to an average of 1 IST under the gate of each transistor for a gate with a length of 0.1 µm and a width of 0.1 µm. This means that the majority of flash memory cells whose active channel dimensions are currently slightly larger than 0.1 µm will be infested with one or more ISTs. Consequently, no matter what the value of the pre-designated amount of drain/source current corresponding to the definition of $V_{TH}$ (typically in the wide range from 400 pA to 2 µA), there will always tend to be some transistors that exhibit IST driven noise at any one chosen value of current.

The source of the type of noise that the present invention addresses is frequently microscopic (e.g. single atom defects, interface traps, and dangling bonds—cf. Reference [2] of the Background section, p. 5060ff). The regions of influence of these microscopic defects are mesoscopic in the sense that the electric field lines emanating out of a charged trap site extend over mesoscopic distances (e.g. hundreds of Angstroms—cf. reference [3] of the Background section, FIG. 4, p. 1032). As electronic devices are miniaturized to sub-micron dimensions, the effects of random trapping/de-trapping events become increasingly more prominent with the dimensions of devices becoming comparable to the mesoscopic dimensions of the regions of influence of these random microscopic phenomena.

One reason that the noise is reduced by the techniques of the present invention may be the following: By applying a varying signal, the memory cell is turned on much harder for shorter intervals than compared to DC sensing. The sensing signal is developed during the high values of the agitating stimulus, and during these short intervals the memory cell is turned on much harder by driving the cell into strong inversion. The charge density in the channel is higher in strong inversion. This means that the inversion layer charge can more effectively screen the field lines that emanate from a charged trap at or near the SiO2/Si interface. Also the stronger the inversion, the thicker the inversion layer and the greater that component of the drain to source current which is flowing in deeper regions from the interface. These deeper currents are screened to greater extents from the random trapping/de-trapping events at the surface.

FIGS. 2A and 2B are a simplified schematic representation of an interface state trap in a generic floating gate transistor. These figures show a floating gate memory from the side, in FIG. 2A, and from the top, in FIG. 2B. These show a control gate CG 201 placed over a floating gate 203, that is in turn over the channel of the substrate 205. When the source S and drain D are biased and a voltage is applied to the control gate, a current flows between the source and drain whose magnitude is determined by the amount of charge stored on the floating gate. When seen from above, the channel area under the pair of gates has a width W and a length L.

The area between the floating gate FG 203 and the substrate 205 is occupied by the floating gate dielectric. The interface between the dielectric and the substrate results in a discontinuity of the structure on either side of the interface that can result in a site for an interface state trap. The density of distribution of such traps in the direction perpendicular to the surface is found to be roughly Gaussian and centered at the interface (see, for reference [4] of the Background section, FIG. 2). A representation of one such a site is shown at 211 in FIGS. 2A and 2B.

When a site is occupied by an electron, this results in a Coulombic barrier due to the electron-electron repulsion that extends into the channel. As a result, the effective channel width is reduced by an amount ΔW. For example, in the random peaks of FIG. 1B, the spikes correspond to the electron de-trapped state and the base current level to the trapped state. The lifetime of a trap is related to the distance of the trap site from the nearest conductor (cf. reference [1], Equation 5). There remains some debate on the issue of the source of the change in current that results from trapping or de-trapping events in the current literature. The change may be modeled as a change in effective mobility, a change in the inversion layer carrier concentration, or both (cf. references [1], [5]). One could also model the change in current as resulting from a change in the effective width, length, and/or electric field. A more accurate model would account for a complex 3 dimensional device that at the present level of scaling is dramatically affected by the occupation state of a single trap. The charge state of the trap can affect every term that occurs in the equation for the device current (e.g. ID=W $\mu_{eff}$ q $N_{inv}$ $E_x$ of reference [5], Equation 1). Even the equation for current that may be valid for a small device that is defect free, may no longer be valid for the same small device if it has become infested with a trap whose state modulates the device current. Equations that are typically used to model the device current assume uniformity of device structure in one or more dimensions. If the defect's range of influence is comparable to the device's active dimensions, then otherwise valid assumptions and equations may become invalid. For a cell with multiple traps, the effects of each site will be superimposed on the base level.

The behavior of a given trap will depend on the bias conditions used to read the cell. As shown schematically in FIG. 2C, the trap 211 is capacitively coupled to the source (S), drain (D), substrate (sub), and gate (G), where the coupling of the control gate is typically through an intermediary floating gate to the trap. The trap can be influenced to varying extents by changing the level on any of these terminals. Many effects of the traps can be modeled as conducting islands, such as are discussed more in reference [6] which is incorporated by reference in the Background.

An exemplary embodiment applies an alternating voltage to one or more terminals of the device just prior to or during the signal development time (integration time) of the reading process. Other external agitations which are repeatable and whose average effect (from one integration time to the next integration time) remains constant may be used in other implementations. The well-known phenomenon of quantum tunneling is the mechanism responsible for the trapping/de-trapping action into deeper border traps whose communication to the nearest conductor is weak enough to warrant a charge localization effect. In terms of tunneling resistance, this means that the tunneling resistance has to be bigger than the quantum of resistance: $R_Q$=h/(2e$^2$)=12.9 kΩ with barriers thinner than 4 nm, the dominant tunneling mechanism is direct tunneling, as is the case for trapping/de-trapping in and out of localized border traps. Many of the deeper oxide traps are also less than 4 nm away from the nearest conductor or semiconductor interface. Some examples of the nearest conductor/semiconductor interface are the channel, the floating gate bottom, or the select gate bottom. A time varying agitating signal may reduce noise if it manages to misalign the discrete energy state of the individual trap/defect/impurity from the Quasi-Fermi level ($F_{N,P}$) of the communication point of the nearest conductor by a few $k_B T$ in each cycle of the agitating signal, where $k_B$ is the Boltzman constant and T is the temperature. This is because if the energy required to transfer electrons across the barrier were smaller than $k_B T$, then such a trap would have very short time constants, switching states many times during any given integration time, and thereby not contributing significantly to noise. This is based on the time averaging principle of Central Limit Theorem that will be elaborated upon later. The communication point of the nearest conductor is that point in the channel, floating gate, select gate, or control gate that is close enough to the trap such that electron tunneling can occur between the trap and that point. In most applications, an energy misalignment of ±3 $k_B T$ should be sufficient.

If the barrier is not thick enough or the energy barrier is not high enough (i.e. if the resistance is less than $R_Q$), then tunneling may not be the mechanism of the electron communication of the defect with the nearest electrode. This may be the case for the interface traps that are very close to the interface, or those that lie in the semiconductor side of the interface. It should also be noted that for such traps, even though there may exist no physical barrier that provides the high resistance, the energy barrier may be a result of the energy required to confine the charge to a potential well of atomic dimensions. In other words, there may not exist insulating atomic layer(s) between the defect, and the nearby electrode; but even in such a circumstance energy may be required to put an electron into the defect site, or to remove an electron from the defect site. In a given system, this required energy may be a result of one or both of two distinct phenomena, namely size quantization, and charge quantization. Size quantization becomes prominent when the dimensions of a potential well become comparable to the Fermi wave length of the electrons in the well. Charge quantization becomes prominent when the capacitance of a defect becomes so small that the Coulomb blockade threshold energy=(e$^2$/2C)=the minimum capacitive energy to be overcome in adding one electron to an N-particle system (reference [7], Equation 10) becomes bigger than $k_B T$, where C is the total capacitance of the trap to the outside world. Although the concept of capacitance is normally used as a lumped parameter attributed to macroscopic systems, capacitance can be used in a microscopic regime down to the atomic level as described in reference [7]. In the microscopic limit, capacitance can be defined as the amount of work per unit charge, ΔV, required to bring a fixed amount of charge, ΔQ, from the vacuum level to the system in question, as described in reference [7].

In general, electron tunneling phenomena require two conductors separated by a thin insulator. The two sides of the tunneling path that give rise to noise are the trap/defect itself and some other conductor or semiconductor, such as another trap, the channel of a transistor, the drain, the source, a gate, or the conducting side of the isolation/semiconductor interface (e.g. the side wall of a shallow trench isolation region). Interface traps and border traps along the transistor channel, particularly those that are closer to the bottlenecks of current, are often the major contributors to the transistor noise. Depending on the type of transistor, the bottleneck of current can be along the channel near the source side, or in case of the embodiments of FIGS. 4A–D in the gap between the floating gate and the select gate. At room temperature, 6 $k_B T$ is 156 mV. To misalign the Quasi-Fermi levels on the two sides of the tunneling path by 156 mV requires much higher voltage excursions on some near-by electrode. In the case of flash memory cells, the control gate can be the electrode of choice for the application of the agitating AC signal. Consider a 1V amplitude AC signal applied to the control gate. Of this 1V, only 0.5V of amplitude is delivered to the floating gate (assuming a 50% control gate coupling ratio to the floating gate). For an interface trap which is at a depth of, for example, 1 nm into the oxide, and 7.5 nm away from the floating gate (assuming a 9.5 nm channel oxide thickness), the capacitive coupling ratio of floating gate to the trap that is modeled as a spherical conductor of 5 Å radius is 10.4%. This result was obtained by a using 3D Poisson equation solver named "raphael" and distributed by Avanti Corporation. The capacitance of the trap to the channel was calculated to be 2.56×10$^{-19}$F, the capacitance of the trap to the floating gate was calculated to be 2.96×10$^{-20}$F, and the total capacitance of the trap was calculated to be 2.85×10$^{-19}$F. The 5 Å radius of the trap is only an educated guess. Also, the assumption that the relative permittivity of the oxide is a constant value of 3.9 may not be valid in the following sense: the few atomic layers between the trap and the channel may be composed of SiO$_X$ (as opposed to SiO$_2$).

SiO$_X$ has less elemental oxygen than SiO$_2$, having some oxygen vacancies. SiO$_X$ may have a different relative permittivity than SiO$_2$. Moreover, Poisson Equation may lose its validity at such small dimensions. Using the above capacitance values results in only 50 mV of a 1.0V control gate amplitude being delivered to the trap. As the channel potential is also being modulated by the AC signal applied to the control gate, a significant portion of the signal's amplitude is being wasted because it is not working to create a voltage difference between the trap and the channel. Taking this into account will only reduce the calculated voltage to below 50 mV. The inefficiencies of delivering the required voltage excursions to the noise sources (with the objective of varying the potential difference between the two sides of tunnel barriers) may typically necessitate the application of high voltage excursions (in the range of multiple volts) applied to any given terminal(s) in order to be effective in reducing the noise. The noise reduction technique disclosed in this application remains valid even if the potential barrier between the trap and the nearest electrode is such that electrons go in and out of the trap by some other mechanism than tunneling. The concept of tunneling is useful in explaining the fact that the time constants associated with trapping/de-trapping span many orders of magnitude, extending from sub-microseconds to many years.

Other examples of episodic agitating stimuli that may have a net noise reduction effect include externally or internally produced photons, phonons, and magnetic fields. The sources of noise that this invention addresses are often microscopic in nature, including trap sites and atomic defects in any physical region of the device. Random electron/hole tunneling can change the state of a trap site. Depending on its position, the vacancy or occupancy of a trap will influence the device behavior. As devices are shrunk to mesoscopic dimensions and beyond, the effects of even a single trap become increasingly more prominent. In future generations these effects may become such a dominant part of the device behavior that even reliable binary operation of very small devices may not be possible. If the time constants associated with the changing of the state of a trap is of the order of or longer than the signal integration time, then the random transitions of a trap between its states will be a source of noise. However, if strong enough stimuli can be provided to a trap to change its state on demand, then by the application of multiple stimuli to the trap during a single signal integration time, the trap is forced to make several independent decisions during each integration time. This can result in reduced device noise since each measurement will consist of several independent sub-measurements. Because traps have memory-like behavior, an alternative to alternating rapidly between sub-measurements and agitating stimuli would be to wait for a period of time longer than the trap's characteristic time constants between any two sub-measurements. However, this wait may be prohibitively long in many instances.

An exemplary embodiment consists of agitating the system during the integration time by applying a trapezoidal AC signal to the gate of an NMOS transistor. In this case, the effective integration time is confined to the time that the gate voltage is high. Due to the non-linear response of the transistor, during most of the fall time, all of the low time, and most of the rise time the gate voltage is below the threshold and the drain to source current is too low to contribute significantly to the average integrated current. For example, assume that for ¾ of the integration time there is no current. To compensate for this and still maintain the same average current as in the standard DC case, during the high time the gate voltage can be increased so that high time current value is 4 times as large as the DC current value.

If, for example, there are 10 AC cycles within one integration interval, then the following situation can be described. The interface trap sites that contribute to noise behave as random, erratic micro-floating gates with memory like characteristics. If the tunneling resistance from the trap to the channel is high enough, then the average occupation/vacancy lifetime of the trapped charge(s) can be of the order of, or longer than, the integration time. In such a case, consecutive measurements may find the same value for the state of the cell. However, a measurement performed much later (with an intervening delay that is longer than the life time of the present occupation state of the trap) could find the state of the cell to be different. This same idea can be extended to a single signal development time (integration time corresponding to a single verify) in the following manner. In one embodiment, multiple AC signals are applied to the control gate of a flash memory cell during a single integration time. As mentioned before, the high value of these stimuli is slightly higher than the DC read voltage, the low value is a number of volts lower than the high value, and the low value durations are sufficiently long so as to force the trap's occupation state into the vacant state, in effect randomizing the trap's occupation state during one high time from the trap's occupation state in the previous high time. In this manner, a single signal development time will be composed of several sub-integration times (high times) during each of which the state of the trap is independent of the state of the trap during the previous sub-integration time. Therefore, the purpose of the high times is to collectively develop the bit line voltage signal through the discharge of the bit line, and the purpose of the intervening low times is to de-correlate or randomize the trap's state during one high time from the trap's state during the next high time. By the end of the low time the trap is forced into its vacant state, and upon the application of the high voltage value to the control gate the trap will make a new random decision to become occupied or to remain vacant. Because we are now only considering traps whose characteristic life times are comparable to or longer than the DC integration time, it is safe to assume that for these traps the state of the trap during each sub-integration time usually remains the same for the duration of that sub-integration time. The noise of the intra-cycle measurements remains correlated to the extent that the trapping/de-trapping life times are comparable to the up time of the signal. On the other hand, inter-cycle noise will be un-correlated as long as the low value is significantly lower than the high value and the low duration is comparable to the high duration. The distribution of multiple AC measurements of average currents, each of which is obtained by averaging current over 10 un-correlated AC cycles, will have a smaller variance when compared to the distribution of the same number of average DC current measurements, each of which has the same integration time as the AC case.

It is well known that the behavior variance in a group composed of individual elements is larger than the behavior variance in a group composed of elements that are composed of an ensemble of the same elements. This is known as the Central Limit Theorem (see pp.954–955 of the Fifth Edition of "Advanced Engineering Mathematics" by Erwin Kreyszig). One of a number of variations of the Central Limit Theorem is as follows: Let $X_1, X_2, \ldots, X_n$ be independent random variables that have the same distribution function and therefore the same mean $\mu$, and the same standard deviation $\sigma$. Let $A_n = (X_1+X_2+\ldots+X_n)/n$. Then the random variable $A_n$ is asymptotically normal in the limit of large n. Also no matter the value of n, the mean of $A_n$ is equal to $\mu$, and the standard deviation of $A_n$ is equal to $(1/\sqrt{n})\sigma$. This implies that a measurable that is composed of the averaging of, for example, 9 independent sub-measurements will have a standard deviation that will be 3 times smaller than the standard deviation inherent in the distribution of each of the sub-measurements. In this context, standard deviation and noise are interchangeable. The most central and the most effective concept presented here is the use of the ability to reduce noise by averaging over several independent sub-measurements. The voltage excursions (agitating stimuli) on any chosen electrode away from that electrode's DC read voltage will preferentially fill or empty the trap, depending on the sign of the excursions. This in effect forces the trap to make a new independent decision about its occupation state every time the excursion is relaxed back to the read value. If sub-measurements are interlaced with these randomizing voltage excursions, then each sub-measurement will be de-correlated from the rest. So the essential role of the episodic agitating stimuli is to de-correlate the state of the trap during one sub-measurement from the state of the trap during the next sub-measurement. The sign of the excursion may be positive or negative. A negative excursion may be simpler to implement in the sense that taking, for example, the control gate voltage below the DC read voltage value naturally cuts off the cell current in an n-channel transistor for the durations of the negative agitating stimuli. However, negative excursions of high enough magnitude will often necessitate the delivery of negative voltages to some electrode, and this may not be readily implemented in some systems. Alternatively, positive voltage excursions may be employed to avoid using negative voltages. However, with positive excursions the n-channel based cell would be turned on much more strongly than desired during the positive excursions, and the read signal would not be properly developed during the times that the desired DC read conditions are being applied. To overcome this problem some other switch in the path of the transistor current has to shut off the cell current during the positive excursions. In the NAND architecture of the embodiment of FIG. 6 the agitating stimuli can be applied to a selected word line, in which case the switch can be the existing drain side select gate, source side select gate, an unselected word line in the same segment, or a combination of the above. In the case of the Dual Floating Gate Source Side Injection (DFGSSI) architecture in the embodiment of FIGS. 4A–4D, the agitating stimuli can be applied to a selected control gate (some times also referred to as the steering gate). In this case the switch can be the select gate (i.e. word line), the transfer gate (the other control gate of a pair of floating gates, also known as the over drive steering gate), or both. In any given architecture, either existing transistor(s) in the path of the current can be used as the mentioned switch(es), or new switching transistor(s) can be designed in to perform the task of shutting off the device current for the durations of the positive agitating stimuli.

There may exists constraints such as the RC time constants of the lines that deliver the AC agitating stimuli, or the $\frac{1}{2}CV^2f$ power requirements. For example, in the case of the DFGSSI architecture in the embodiment of FIGS. 4A–4D over a thousand control or steering gate lines must be driven up and down at high frequencies in order to read the contents of a sector (512 bytes), requiring a relatively large amount of power to implement the multiple AC cycles agitating stimuli on every verify step of a binary search read. The following are some methods to mitigate this issue. The RC time constants of the lines that deliver the agitating stimuli may be reduced by silicidation of poly-silicon lines, by converting typically poly-silicon lines to metal lines, or by reducing the local line segmentation lengths and delivering the agitating stimuli to only local segments (using local booster plates or booster lines which capacitively couple to the lines of interest). It has been found that noise can be reduced by the above method even though the effective integration time has been cut to a quarter of the DC integration time.

Under the DC read conditions a troublesome trap can either be occupied or vacant. For simplicity, consider the case where the Quasi-Fermi levels of the electron trap and the nearby channel are aligned under the DC read conditions. In this case, the trap is on the average vacant 50% of the time (i.e. $P_V$=0.5) and occupied the other 50% of the time (i.e. $P_O$=0.5). Further assume that the tunneling resistance is such that the mean occupation life time is $\tau_O$=1000 $\mu$s. The mean vacancy life time will also be $\tau_V$=1000 $\mu$s under these assumptions. Therefore, the mean time between same kind transitions is $\tau_T$=1000+1000=2000 $\mu$s where $\tau_T$ is the average time from one tunneling-in event to another tunneling-in event, or from one tunneling-out event to another-tunneling out event. Note that because of the Pauli exclusion principle, between any two tunneling-in events into the same trap a tunneling-out event will have occurred. Assuming a DC read integration time of 10 $\mu$s, one read may find the electron trapped and another read may find it de-trapped. The chances of one or more tunneling events within a DC integration time are fairly low. But if another read is performed a few seconds later, then the results of these two reads are un-correlated. Thus, there is a high correlation in the state of the trap (short term memory of the trap) within any single DC integration interval and a low correlation between reads that are performed with longer (as compared to $\tau_T$) intervening delays.

Consider the case of AC sensing where the control gate voltage of a flash memory cell is varied 10 times with a trapezoidal pulse train of several volts in amplitude, and less than 1 $\mu$s in period so that there is no loss in read performance. The high voltage value of the pulses should be greater than the DC read value so that the current during the high time is 4 times more than the current during the low time because of a 25% duty cycle. The low value of the pulses should be low enough to almost guarantee that during every low pulse the electron vacates the trap. This makes the state of the trap during each high time independent of the state of the trap during the previous high time. For the sake of argument, assume that every 1V on the control gate will have a ten fold effect on the occupation probability. So if under the DC read conditions $P_O$=0.5 and $P_V$=0.5, then with 1 more volt on the control gate $P_O$ becomes 0.95 and $P_V$ becomes 0.05. Another volt on the control gate will make the probabilities $P_O$=0.995, and $P_V$=0.005. If the control gate voltage is reduced by 1V from the DC read condition, then $P_O$ becomes 0.05 and $P_V$ becomes 0.95. The assumptions of symmetric tunneling properties in and out of the trap, and 1V per decade change of probability are introduced to simplify the explanation. The validity of these assumptions do not affect the efficacy of the noise reduction technique. In the example of interface state traps, the Fermi level of interest is the channel Fermi level at a point in the channel directly underneath the interface state. If the trap energy level is below the Fermi level, then the trap is usually occupied, and occasionally becomes unoccupied. In such cases, the DC read current is at some base value most of the time with occasional short duration up-spikes. Alternatively, when the trap energy level is above the Fermi level, then the trap is usually unoccupied and occasionally becomes occupied. In such cases, the current is at some base value most of the time with occasional short duration down-spikes. The more energetically un-favorable it is for a trapping (or de-trapping) event to occur, the longer the lifetime of the initial de-trapped (or trapped) state. The difference $\Delta E=(E_f-E_i)=(E_{final}-E_{initial})$ between the total system energy $E_1$ before and the total system energy $E_f$ after the trapping/de-trapping event dictates the probability of this event. The greater the $\Delta E$, the less likely is the transition event, and the longer the lifetime of the initial state with energy $E_1$. If $\Delta E$ is negative, then the lifetime of state $E_i$ is short.

The more negative the value $\Delta E$, the shorter the lifetime of state at $E_i$. $\Delta E$ is composed of at least two components: 1) the electrostatic energy difference between before and after the transition, 2) the work expended by the power supplies to put an electron across a resistive tunnel barrier which has two different potentials at the two sides of the barrier. For example, if the electrostatic component of $\Delta E$ is much less than $k_BT$, but the tunneling resistance $R_T$ is large, then the probability of tunneling per unit time is small and the life time of both the trapped, and the de-trapped states are long. In such cases, over long periods of time, the current is roughly half the time at some high value, and half the time at some low value with either frequent or infrequent transitions between the two values depending on the trap's tunneling resistance.

Going back to the noise reduction technique of the exemplary embodiment, the alternating signal can have a variety of different waveform shapes including, but not limited to, sinusoidal, rectangular, triangular, and trapezoidal. As the response of the cell is non-linear, the combined periodic and non-periodic portions of voltage applied to a terminal may not have the same average value as the DC portion alone. For example, FIG. 3 schematically shows the example of the periodic disturbance ($V_{per}$) being applied to the gate along with a non-periodic voltage ($V_{aper}$). The combined waveform 307 may not be symmetric about the level (313) that would be used to measure the same data state without the AC portion. As the effect of the peaks may saturate if they are too high, the combined waveform is arranged so that it is sufficiently high and low at the extreme peaks. Furthermore, an integer number of cycles of the periodic portion need not be used. As long as the waveform is reproducible for a given state that is to be measured and achieves the desired effect, it may be used.

To achieve the desired trapping/de-trapping, the exemplary embodiments use a waveform with a 50% duty cycle for de-correlating the reads as the main effect is at the bottom and top of the cycle. For this reason, it may be preferable to use a square or trapezoidal wave as these have a greater portion of their duty cycle at the peak levels when compared to a sinusoidal or triangular waveform. Although a square wave maximizes the peak values, in practice a square waveform suffers from overshoot (Gibbs phenomenon) that, particularly at the high end, can have undesirable effects in terms of reproducibility. Consequently, a trapezoidal waveform is often the best compromise.

Although FIG. 3 shows the stimulus applied to the gate for explicatory purposes, other embodiments may apply the stimulus to another terminal. As shown in FIG. 2C, the voltage level at a trap can be affected by changing the voltage on any of the terminals of the cell that can deliver some portion of this voltage in a preferential manner to one of the two conducting entities on each side of the tunnel junction. For example, it may be applied to the substrate, allowing the stimulus to be applied to many cells simultaneously, and also avoids interfering with the read voltages applied to the gate. Other examples are discussed below for various cell embodiments.

The circuits that set the various voltages will be part of the decoders and circuit drivers that form the peripheral elements in the circuit array. These are described more fully in U.S. Pat. Nos. 5,172,338 and 5,272,669, which were incorporated by reference above, and in U.S. Pat. Nos. 5,712,180 and 6,103,573 and U.S. patent application Ser. No. 09/505,555, filed on Feb. 17, 2000, and Ser. No. 09/667,344, filed on Sep. 22, 2000 which are hereby incorporated by reference, and are referred to below in relation to the multiple floating gate embodiment.

The state of a storage unit can be determined using a number of different parameters. In the examples above, the determination of a cell's stored charge level can be performed by current sensing, where the magnitude of its conduction, using fixed bias conditions, is sensed. Alternately, such determination can be made through sensing threshold voltage, where the onset of such conduction is sensed using varied steering gate bias conditions. These methods represent a couple of the more standard approaches.

Alternately, the determination could be performed dynamically by having the cells' charge-level determined driver-strength control the discharge rate of a dynamically held (by, e.g., a pre-charged capacitor) sense node. By sensing the time to reach a given discharge level, the stored charge level is determined. In this case, the parameter indicative of the cell's condition is a time. This approach is described in U.S. Pat. No. 6,222,762, which is hereby incorporated by reference, and in U.S. patent application entitled "Sense Amplifier for Multilevel Non-Volatile Integrated Memory Devices" that has been incorporated by reference above. Another alternate technique determines the state of the storage unit using frequency as the parameter, an approach described in U.S. Pat. No. 6,044,019 that has also been incorporated above.

Current sensing approaches are more fully developed in U.S. Pat. No. 5,172,338, that was included by reference above, and U.S. patent application Ser. No. 08/910,947, which is hereby incorporated by reference, and may be employed with the various embodiments described below. However, the majority of the following exposition uses the threshold voltage, $V_{th}$, sensing approach (alternately termed voltage margining) since this improves the sensing resolution, keeps the current, and consequently the power, associated with massively parallel read operations low, and minimizes vulnerability to high bit line resistance. The $V_{th}$ sensing, or voltage margining, approach is developed more fully in U.S. Pat. No. 6,222,762. Another technique of voltage sensing, monitoring the voltage at the source for a fixed drain voltage in response to a given gate voltage, is the source follower technique that is described, for example, in U.S. patent application Ser. No. 09/671,793, incorporated by reference above.

A binary search technique, or a slower linear search technique may be employed to find the state of the cell. In such a schemes a read operation will be composed of several verify operations. Each verify operation consists of applying a certain DC control gate voltage to the cell, and checking to see if the cell is ON or OFF at the applied control gate voltage value. A number of such verify operations done at intelligently chosen control gate values will then comprise the read operation. Each verify can be done in a number of different ways such as current sensing versus voltage sensing, dynamic sensing versus static sensing, and time to trip sensing versus fixed time sensing. Most of these variations have been discussed or referred to earlier. Dynamic-fixed-time-sensing would consist of the following sequence of events. 1) Apply a desired voltage to the control gate and hold it at that voltage until after the sensing has been finished. 2) Pre-charge the bit line to a fixed voltage. 3) Release the bit line allowing the cell current to bring down the bit line voltage. 4) After a fixed amount of time elapses from the releasing event, latch in the state of the cell based on the bit line voltage being above or below a pre-designated value. 5) Now the control gate voltage can either be returned to its stand-by value, or be forced to the next desired value for another verify operation.

In one embodiment, each verify step of the read operation can be preceded by a single pulse agitating stimulus, or by multiple pulses of the agitating stimulus just prior to the start of the integration, that can be referred to as preconditioning. Alternatively, or additionally, single or multiple pulses of agitating stimuli can be applied during the integration time. Preconditioning, alone, may have the following benefits. A single downward preconditioning voltage pulse may set most traps into their vacant state. If a greater majority of traps are such that under the DC read conditions their vacant state life times are longer than their occupied state life times, and also comparable to or longer than the integration time, then negative-going preconditioning pulse(s) may have an overall noise reducing effect. This may be the case for some insulating materials, and some typical DC read conditions. If a greater majority of traps are such that under the DC read conditions their occupied state life times are longer than their vacant state life times, and also comparable to or longer than the integration time, then positive-going preconditioning pulse(s) may have an overall noise reducing effect. This may be the case for some insulating materials, and some typical DC read conditions. While there may be material tendencies in some cases favoring the negative-going preconditioning pulses, there always exist many exceptions to the rule. On the other hand, strong enough positive-going preconditioning pulse(s) may have an overall noise reducing effect because it (they) may go a long way towards recreating the historical conditions of the first verify right after a programming pulse. Knowing that various traps have different short term parasitic memories, the ability to at least partially recreate the short term history conditions just prior to the first verify after the last programming pulse may reduce noise. From measurements over a rage of transistors covering various process technologies, it is observed that preconditioning is of limited effectiveness, and the most effective way of reducing noise is to apply multiple de-correlating pulses during each measurement such that each measurement is an average of multiple independent sub-measurements. The larger the number of independent sub-measurements contained within each measurement, the lower the noise associated with the measurement. As mentioned earlier, if N is the number of sub-measurements comprising each measurement, then the noise is reduced by a factor of $(1/\sqrt{N})$. With N=9 the amplitude of noise in measuring the $V_{TH}$ of a transistor can be reduced by a factor of 3, just based on the Central Limit Theorem. If a factor of 10 of noise reduction is required then N should be increased to a value of 100. As can be seen, this method of noise reduction can in some embodiments be more expensive in terms of both the energy consumed, and the time required to perform all these independent measurements. One way to mitigate this, is to apply the agitating stimuli only at the more sensitive verify steps of a binary search read.

An alternative embodiment based on the idea of re-read is as follows. Many technologies rely on Error Control Coding (ECC) to flag an error in the read of, for example, a sector of memory. The agitating stimuli could be invoked only upon a re-read of a sector, after the first attempt to read the sector has produced too many errors to be correctable on the fly, or to be correctable at all. Alternatively, a single de-correlating pulse can be applied between any two reads of the sector. Having performed a number of reads of the same sector in this manner, the noisy cells can be identified as those whose states vary from one read operation to another. Identifying the address of the noisy cells allows the following two approaches to recovering the data: 1) With the knowledge of the noisy cell addresses, the ECC capabilities are dramatically increased by reducing the level of error correction required and redirecting these capabilities to error detection. 2) Different combinations of the neighboring data states of the noisy cells can be fed to the ECC engine until the ECC shows no errors. Gray scaling the states of a memory cell allows the neighbor states to any state to be different form that state by exactly 1 bit, further reducing burden on ECC due to nearest neighbor state transitions, as may be induced by cell noise.

In the prior art cited in the Background (see, for example, references [8], [9], [10], and [11]), it has been noted that cycling the voltage applied to a MOS transistor between strong inversion and accumulation reduces its 1/f noise observed in strong inversion, although none of the cited references present a practical noise reduction technique for use in memory systems. Additionally, the various aspects of the present invention further extend the art in a number of additional ways: 1) cycling from inversion to accumulation is only a subset of the possible variety of voltage magnitudes and directions that can be applied as agitating stimulus; 2) a varying voltage is only one form of an agitating stimulus; 3) no specific practical noise reduction technique has been presented in the prior art, whereas the present patent invention presents a variety of detailed techniques that make the deployment of these and many other new ideas practical in, for example, non-volatile memories; 4) in none of the former art can one find the idea that the most powerful noise reduction effects can be achieved by the use of multiple agitating stimuli during a single integration time. 5) there has been no mention of the Central Limit Theorem to explain the efficacy of multiple agitating stimuli in any of the prior art. The present invention's progess beyond the prior art includes generalizing to any kind of agitation, taking advantage of the Central Limit Theorem to reduce the noise indefinitely at the expense of averaging larger number of sub-measurements, generalizing to not just cycling between accumulation and inversion but also to cycling the gate between the DC operating voltage and any other value (higher or lower), generalizing to cycling not just the gate, but any terminal of a device, generalizing to any kind of electronic device as opposed to just MOSFETs, as specified in a variety of implementations.

A preferred embodiment uses a trapezoidal waveform whose low time, rise time, high time, and fall time are each a quarter of the period of the waveform. The larger the amplitude of the signal, the greater its capability to suppress noise. The high level of the signal is dictated by the $V_{TH}$ of the transistor and cannot exceed the $V_{TH}$ by much if the AC signal is being applied during the integration interval as this results in the transistor being fully on independent of its data state.

Yet another embodiment that uses multiple pulses whose low value is the DC read value and whose high value is much higher can be applied within a single integration time. This requires the existence of another gating element in the path of the cell current, such as a separate select gate in a NOR architecture. This gating element must be shut off in order to stop the otherwise excessive cell current during all those times when the gate voltage is driven well above the $V_{TH}$ of the cell. In a NAND architecture, this gating element can be a non-selected word line within the selected NAND string, the source select transistor, or the drain (bit line) select transistor. In the dual floating gate embodiment of FIGS. 4A–D, the gating element can be the control (i.e. steering) gate of the non-selected floating gate in a storage unit or the select gate.

This technique is a departure from the prevailing practice in the prior art of reducing noise by quieting down the system before and during the sensing. This technique allows for, and finds high levels of activity beneficial as long as the activity is always reproducible during each sensing period, or the period of the associated stimulus is much shorter than the integration time. If the episodic signal can be synchronized in a reproducible way with the integration interval, then the period of the signal can be enlarged to become comparable to the integration time. Synchronization can result in the percent high duration during an integration interval remaining constant across various integration intervals. It has been found that applying AC signals to the gate or the substrate of a transistor can significantly reduce noise. With AC waveforms that are synchronized to the integration interval, even one cycle per integration time has significantly reduced noise in many instances.

So far this discussion has been based on an embodiment using the generic floating gate cell of FIGS. 2A and 2B, but may be applied more generally to cells with other constructs as the various aspects of the present invention are not particularly dependent on the cell type. For example, there exist EEPROM cells that contain a select gate in addition to the control gate (e.g. the DFGSSI architecture). In particular, another exemplary embodiment that contains a select gate also uses a cell with a multiple floating gate structure. Non-volatile memory cells with this structure are described in U.S. Pat. Nos. 5,712,180 and 6,103,573 and U.S. patent applications Ser. No. 09/505,555, filed on Feb. 17, 2000, Ser. No. 09/667,344, filed on Sep. 22, 2000, which were incorporated by reference above. FIGS. 4A–D are adapted from U.S. Pat. No. 5,712,180 and show such a cell.

FIGS. 4A and 4B show top and cross-sectional views, respectively, of one embodiment of a memory storage unit with multiple floating gates. As shown in the cross-sectional view of FIG. 4B, a channel of the cell is formed between the two source/drain regions of bit-lines BL1 711 and BL2 712. The channel is subdivided into three regions: a left floating gate channel 761 under the left floating gate FGL12 781 and left control gate CGL2 771; a right floating gate channel 763 under the right floating gate FGR12 783 and right control gate CGR2 773; and, between these, a select channel 762 underneath the select transistor T12 772.

As shown in FIG. 4A, in this structure the word-lines, such as SG1 720, cross the bit-lines, such as BL1 711 and BL2 712, to form the array. The memory cell locations within the array are then defined by the intersection of these lines; for example, the cell of FIG. 4B with select transistor T 12 772 lies along word-lines SG1 720 between BL1 711 and BL2 712. The control gates, however, are now connected along the columns parallel to the bit-lines instead of along the rows as in the more traditional architectures. Thus, by applying a voltage to the control gate line CGL2 771, this voltage is applied not just to the gate of the cell containing transistor T12 772, but also to the left control gates of all of the cells in the column between bit-lines BL1 711 and BL2 712. FIG. 4C is a circuit diagram depicting one embodiment of an array of memory cells such as those of FIGS. 4A and 4B, where FIG. 4C is an equivalent circuit of these memory cells. The floating gates 781 and 783 of the cell can be programmed and read independently. More details on the operation of such a cell are provided in the references incorporated by reference above.

In the cell of FIGS. 4A–C, interface state traps can be located anywhere along the channel at or proximate to the substrate-dielectric interface. This can be under either of the floating gates, under the select gate, or in the gaps between the gates, as with site 799 of FIG. 4B. The site will be capacitively coupled with various strengths to all of the terminals of FIG. 4C as well as to the substrate. In addition to stimulation by changing the level on the control (steering) gates, source, drain, and substrate, the introduction of a select gate provides another terminal to which an episodic stimulus can be applied. The direct capacitive coupling to select gate will be strongest for trap sites in the select channel region under the select gate, but will also affect sites in the floating gate channel, both through fringe field coupling and through the coupling of the site to the floating gate which is in turn capacitively coupled to the select gate ($C_{31L}$ and $C_{31R}$ in FIG. 4C). This is true also in single floating gate storage devices that include a select transistor.

The cells of FIGS. 4A–C are arranged in array such as that shown in FIG. 4D. An exemplary embodiment applies an AC trapezoidal signal to the word lines (e.g. to 720) which is connected to the select gates (e.g. 772) or alternately applies the AC signal to the substrate instead of to the control (steering) gates (771 and 773). A modulation of the select gate voltage from a low value of 0V to a high value of 6V has been found to effect a reduction in noise in some cells.

Implementing the AC signal on the word lines, such as 720, has several advantages. For each sector being read, which typically may contain from hundreds to thousands of cells that are read in parallel, only one word line need be driven. In the case of periodic signal driving the lines connected to a column of a floating gates (e.g. the "steering lines", such as 771 or 773), the steering lines of all the cells being read in parallel have to be driven up and down at the same time. This produces a power consumption of ($\frac{1}{2}CV^2f$) for each line, where f is the frequency of the periodic signal, V its amplitude, and C is the line's total capacitance. This would result in a large power consumption in the case of AC driven control (steering) gates. In addition, it would expose all the unselected cells on the same steering lines to potential disturb conditions.

Again referring to FIGS. 4A–4D, another advantage of driving the select gate by supplying the episodic stimulus through the word line is that, in a typical read or verify process, the conventional operating voltage of the word line is generally some fixed value, for example 5V, independent of cell data being read. This readily allows the application of a signal with a 6V amplitude with fixed high (6V) and low (0V) values. The control gate read voltage, on the other hand, is data (state) dependent in many reading techniques, such as those described in the applications included by reference above. For states with low control gate threshold, a high amplitude AC signal results in the signal's low value becoming negative. This may be hard to implement in many devices and could possibly introduce disturbs. There are also other circuit design related complications with the episodic stimulation of the control (steering) gates during the integration period of the read process, potentially making the select gate stimulation simpler to implement during the sensing (integration) time.

Methods of reading memory cells are described in U.S. patent application Ser. No. 09/671,793, filed on Sep. 27, 2000, and in the patent application entitled "Sense Amplifier for Multilevel Non-Volatile Integrated Memory Devices", filed on Nov. 20, 2001, both of which were incorporated by reference above, and in references contained in these applications.

In sensing a non-volatile memory cell, whether as part of a read operation or as part of the verify phase of a program operation, there will typically be several phases. These include applying voltages to the cell so that it is biased appropriately for its data content to be sensed or measured, followed by an integration period that measures a parameter related to the state of the cell. In an EEPROM cell, the parameter is usually a voltage or the source-drain current, but can also be a time or frequency that is governed by the state of the cell. An example of one embodiment for the sense voltages of this measurement process is shown schematically in FIG. 5A.

FIG. 5A shows the voltage level on a bit-line of a memory array, for example BL1 711 in FIG. 4D. The first phase sets the gate voltages on the cells. In the second phase, the bit-lines of the cells to be read are charged up to a predetermined level. The integration time is the third phase, beginning at a time t=0, when the bit line discharges through the cell and the voltage level decays at a rate dependent on the state of the cell. After a time t=t', the voltage level on the bit-line is measured relative to a reference level $V_{ref}$. If the voltage is at or above $V_{ref}$, as in line 501, the cell is considered in an off state. If the voltage is below $V_{ref}$, as in line 503, the cell is considered in an on state and that, consequently, the voltage on the control gate is above the threshold voltage of the cell.

The inclusion of noise complicates this situation, as shown in FIG. 5B. FIG. 5B shows just the integration portion of FIG. 5A, but with the inclusion of noise for the decay lines 501 and 503. As both the lines show, the fluctuations due to noise can cause an erroneous reading at the time t' if there is a fluctuation in a direction that would result in a mis-read. Since the lines 501 and 503 diverge with time, increasing the integration time will lead to greater separation, but at the expense of slower read times. Additionally, the extent to which t' can be extended is limited as the voltages will eventually bottom out. An alternative approach, as described in the patent application entitled "Sense Amplifier for Multilevel Non-Volatile Integrated Memory Devices", is shown in FIG. 5C. In this variation, the cell is biased so that the trip point level $V_{ref}$ is at the same value as the precharge level of the second phase. In this manner, the off state (501) continues to diverge from the on state (503) in time without both lines bottoming out. The on state will bottom out given enough integration time, and the off state will top out given enough integration time.

The process described with respect to FIGS. 5A–C is just one of many reading techniques. Depending on the technique used to read the cell, the second, precharging phase of sensing may be combined with the first phase. Also, both the parameter that is measured and how it is measured varies in different techniques. For example, in the technique of U.S. Pat. No. 6,044,019, that was incorporated by reference above, the measured parameter is a frequency indicative of total amount of current accumulated during the integration period.

The techniques of the present invention can be implemented in a number of different ways with any of these read techniques. For example, in one set of embodiments a single or periodic stimulus can be applied in one of the earlier phases of the read process so that the condition of the cell is randomized prior to beginning the integration phase. This could be done either prior to setting the gate voltages, or while the gate voltages are being set, or during the precharge phase, or some combination of these. The integration phase can then be executed without the concurrent exposure to the episodic stimulation.

In another set of embodiments, the stimulation is applied during the actual integration phase, either starting prior to t=0 (as given in FIGS. 5A–5C) in an earlier phase and continuing into the integration phase or with the stimulus lying entirely between t=0 and t'. In some cases, containing the stimulus entirely within the integration period can make it easier to reproduce the disturbance. For instance, in the twin floating gate cell described with respect to FIGS. 4A–D, a periodic voltage oscillation between channel turn on and shut off conditions could be applied to the select gate 772 for a predetermined number of cycles, for example n, during which time the total current flowing over the integration time interval is measured. This results in the read value corresponding to the integration of N independent sub-read values of shorter duration, matching the channel turn on intervals of the periodic voltage approach with the DC read conditions.

Another arrangement of floating gate memory cells is a NAND architecture, such as that described in U.S. patent application Ser. No. 09/893,277, filed on Jun. 27, 2001, which is hereby incorporated by reference. A NAND array is shown in FIG. 6 that is adapted from this application. This figure shows columns of, in this example, four memory cells connected between a pair of select transistors to form the bit lines BL0 to BLN. Lines SGD_i and SGS_i are respectively connected to the drain and source select transistors of each column, and the control gates of the memory cells in each row are connected along a given word line WL_i. To read, for example, cell 601 in column 1, row 1, the bit line BL1 is precharged to a level $V_{BL}$, the select transistors and non-selected word lines are set at a pass voltage $V_{pass}$ sufficient to turn all of the transistors in column 1 other than 601 fully on, and the selected word line WL1_i is set to a (here data dependent) read voltage $V_{WL}$. The bit line BL1 then discharges at a rate determined by the data content of the storage element 601.

The larger the amplitude of the signal, the greater its capability to suppress noise. The high level of the signal is dictated by the $V_{TH}$ of the transistor and cannot exceed the $V_{TH}$ by much if the episodic stimulus is applied during the integration interval since this results in the transistor being fully on independent of its data state. This restriction can be lifted by independently shutting off a transistor in the path of the current during the application of stimuli that exceed $V_{TH}$ as discussed earlier. A first set of embodiments uses pulses whose low value is the DC read value and whose high value is much higher can be applied within a single integration time. This gating element must be shut off in order to stop the otherwise excessive cell current during all those times when the gate voltage is driven well above the $V_{TH}$ of the cell. This gating element can be a non-selected word line within the NAND string of the column, the source select transistor, or the drain (bit line) select transistor. This is shown in FIGS. 7A and 7B.

FIG. 7A shows an episodic stimulus consisting of a single trapezoidal pulse applied on the single word line, corresponding to the voltage $V_{WL}$. The selected word line is held at a normal read value during the precharge and signal development phases, with the stimulus applied during the stress period. The pulse reaches an exemplary value of 8V, a value the would turn the selected transistor on that word line fully on and rapidly discharge the bit line regardless of the data state stored on the transistor. To prevent this, the waveform $V_{pass}$ is applied to one of the other transistors in the column. By taking this other transistor to a voltage substantially below its threshold during the stress period, it is turned off and the bit line charge is maintained. The other transistors can be kept at the standard pass value, here 5V. The resultant voltage on the bit line $V_{BL}$ is shown in the top waveform. It is initially precharged in this example to a value of 0.8V, at which point it begins to decay at a rate determined by the relation between the state of the selected cell and the read value on the bit line. $V_{pass}$ is then taken low, allowing $V_{BL}$ to remain steady, while $V_{WL}$ is stressed to 8V. The selected word line is then returned to its read value, $V_{pass}$ is returned to 5V, and the signal development is allowed to continue until the parameter value is latched at t'.

FIG. 7B is similar to FIG. 7A, except now multiple pulses above the read voltage are applied to the word line. A corresponding set of dips in $V_{pass}$ is used to maintain the level on $V_{BL}$ while these pulses are applied. The resultant behavior on the bit line consists of the decay of $V_{BL}$ being broken up by a set of flat terraces when $V_{pass}$ is at 0V.

FIG. 7C shows an example of an alternate set of embodiments. In this case, the select transistors and all of the non-selected word lines are held on at the constant pass value of, here, 5V, as shown by the constant value of $V_{pass}$. The stimulus on the selected word line is now a series of pulses taking $V_{WL}$ from the read value down to, for example, −6V. As before, the resultant $V_{BL}$ waveform remains flat during the pulses, but no additional $V_{pass}$ signal is required since the stimulus does both jobs of applying the necessary stimulating voltage and conduction cutoff.

Although the discussion thus far has focused on embodiments using EEPROM cells for the memory device, it can be applied to other embodiments wherein similarly influencible sources of noise are a problem, including magnetic and optical media. This invention can have far reaching applications in all types of device/transistor sensing, including, but not limited to, sub 0.1 um transistors, single electron transistors, organic/carbon based nano-transistors, and molecular transistors. For example, NROM and MNOS cells, such as those respectively described in U.S. Pat. No. 5,768,192 of Eitan and U.S. Pat. No. 4,630,086 of Sato et al., or magnetic RAM and FRAM cells, such as those respectively described in U.S. Pat. No. 5,991,193 of Gallagher et al. and U.S. Pat. No. 5,892,706 of Shimizu et al., all of which are hereby incorporated herein by this reference, could also benefit from this invention. For these other types of storage elements, the particular mechanics of determining the parameter that reflects the state of the element may differ, for example magnetic properties would be measured in a magnetic medium and optical properties would be measured in a CD-ROM or other optical media, but the subsequent process follows readily from the examples above. Using this approach, existing material systems which are non-practical because they suffer from high density of noise sources such as interface states or other atomic scale transient trapping/de-trapping sites may become viable technologies for high density storage or small signal applications. As miniaturization continues to create ever smaller devices, the random (quantum) behavior of fluctuations inherent to devices becomes more prominent, and this technique provides a potential means to reduce the impact of consequent noise in the associated system by eliminating or reducing its random nature.

Yet another application of this invention may be to produce more uniform conduction characteristics (e.g. subject to statistical variations of the threshold voltage $V_{TH}$) of very small transistors with prominent dopant fluctuation effects. Here the $V_{TH}$ of macroscopically identical transistors may be different because of microscopically varying dopant locations. The standard deviation of a sample of such $V_{TH}$s obtained under DC conditions may be reduced by using the currently disclosed noise reduction technique. For example, dopant fluctuation effects can give rise to excessive behavior variations across a collection of otherwise identical devices. An example would be increased spread in the threshold voltage of a collection of transistors that are meant to be identical. Dopant fluctuation effects increase as device sizes decrease to the point that there are few dopant atoms in the active portion of a device. This may result in non-uniform current densities at scales approaching the dimensions of the active regions of the device. Different DC voltages applied to the gate or the drain of an exemplary device may result in new dominant current conduction paths. In other words, changing biases may shift the path(s) of least resistance. If different DC biases change the behavior of a device, then time varying the bias has the same effect as moving to a new device. Again, reference can be made to the Central Limit Theorem to explain the possible reduction in behavior variance under AC conditions as opposed to DC conditions.

Other forms of episodic stimuli that effect the state of the cell or the value of the parameter measured can also be used. As noted above, other agitating stimuli that may have a net noise reduction effect include externally or internally produced photons, phonons, magnetic fields, mechanical vibrations or stresses, and thermal stresses. For example, externally applied alternating electric and magnetic fields may also be used to reduce noise. In particular, an alternating magnetic field could be used in a magnetic type memory cell, where it directly affects the cell, or even in a floating gate cell, where is could affect the cell through induced voltages. Increasing the temperature may have a 1/f noise reduction effect, but it will also increase thermal noise. Cycling through different temperatures may offer a method of reducing noise. In any of these cases, the techniques of the present invention allow the steady state or DC characteristics of a memory cell to be read with reduced noise using a periodic or AC stimulus.

Although the various aspects of the present invention have been described with respect to specific exemplary embodiments, it will be understood that the invention is entitled to protection within the full scope of the appended claims.

What is claimed is:

1. A method of reading the data content of a non-volatile memory storage unit, comprising:

applying a set of sense voltage waveforms to the terminals of the memory storage unit during a read interval;

measuring a parameter value related to the data content of the memory storage unit during the read interval, wherein the measured value for the parameter includes the contribution of a noise component;

applying an episodic stimulus to the memory storage unit during the read interval, wherein the level of stimulus affects the parameter value and whereby the contribution of the noise component is reduced.

2. The method of claim 1, wherein the parameter is a current.

3. The method of claim 1, wherein the parameter is a voltage.

4. The method of claim 1, wherein the parameter is a time.

5. The method of claim 1, wherein the parameter is a frequency.

6. The method of claim 1, wherein the memory storage unit is a floating gate transistor and the measuring a parameter value comprises applying a non-periodic voltage to a first control gate of the transistor, and wherein the parameter is measured between a first and a second source/drain region of the transistor.

7. The method of claim 6, wherein the episodic stimulus is a periodic voltage waveform.

8. The method of claim 7, wherein the floating gate transistor further includes a select gate and the episodic stimulus is applied to the select gate.

9. The method of claim 7, wherein the episodic stimulus is applied to the first control gate of the transistor.

10. The method of claim 7, wherein the episodic stimulus is applied to the substrate of the transistor.

11. The method of claim 10, wherein the floating gate transistor has dual floating gates, the first control gate being located over a first of the dual floating gates, and further comprises a second control gate over the second of the dual floating gates, wherein the select gate is situated between the two control gates.

12. The method of claim 7, wherein the periodic voltage has a sinusoidal wave form.

13. The method of claim 7, wherein the periodic voltage has a rectangular wave form.

14. The method of claim 7, wherein the periodic voltage has a trapezoidal wave form.

15. The method of claim 6, wherein the parameter is the current flowing in a channel region of the floating gate transistor.

16. The method of claim 6, wherein the parameter is a voltage required to established a predetermined current.

17. The method of claim 6, wherein the episodic stimulus is a single voltage pulse.

18. The method of claim 6, wherein the read interval comprises a first phase and a subsequent second phase, wherein the measuring a parameter is performed during the second phase and the applying a set of sense voltage waveforms begins during the first phase.

19. The method of claim 18, wherein the episodic stimulus are multiple voltage pulses.

20. The method of claim 18, wherein the episodic stimulus is applied during the second phase.

21. The method of claim 18, wherein the episodic stimulus is applied during the first phase.

22. The method of claim 1, wherein the memory storage unit is a magnetic memory cell and the episodic stimulus is a magnetic field.

23. The method of claim 1, wherein the wherein the memory storage unit is a molecular transistor memory storage unit.

24. The method of claim 1, wherein the wherein the memory storage unit is a single electron transistor memory storage unit.

25. The method of claim 1, wherein the wherein the memory storage unit is a nano-transistor memory storage unit.

26. The method of claim 1, wherein said applying an episodic stimulus is invoked in response to an error control coding result.

27. The method of claim 1, wherein said read interval comprises a first portion and a subsequent second portion, and wherein said applying a set of sense voltage waveforms comprises:
applying a first set of sense voltage waveforms to the terminals of the memory storage unit during the first portion of the read interval; and
applying a second set of sense voltage waveforms to the terminals of the memory storage unit during the second portion of the read interval;
wherein said measuring the parameter value comprises:
measuring the parameter value related to the data content of the memory storage unit during the first portion of the read interval; and
measuring a parameter value related to the data content of the memory storage unit during the second portion of the read interval; and
wherein said applying an episodic stimulus is performed during the second portion of the read interval in response to said measuring the parameter value related to the data content of the memory storage unit during the first portion of the read interval.

28. The method of claim 27, wherein said applying an episodic stimulus is invoked in response to an error control coding result.

29. A method of operating of a non-volatile memory, comprising:
applying a set of voltages to a storage unit of the non-volatile memory during an interval;
determining the conduction characteristics of the storage unit in response to the set of voltages, wherein the set of voltages includes a sense voltage condition and an episodic stimulus component distinct from the sense voltage condition.

30. The method of claim 29, wherein the determining the conduction characteristics comprises measuring a current.

31. The method of claim 29, wherein the determining the conduction characteristics comprises measuring a voltage.

32. The method of claim 29, wherein the determining the conduction characteristics comprises measuring a time.

33. The method of claim 29, wherein the determining the conduction characteristics comprises measuring a frequency.

34. The method of claim 29, wherein the memory storage unit is a floating gate transistor and the set of voltages further includes applying a non-periodic voltage to a first control gate of the transistor, wherein the determining the conduction characteristics includes measuring a parameter between a first and a second source/drain region of the transistor during a read interval.

35. The method of claim 34, wherein the episodic stimulus is applied to the control gate of the transistor.

36. The method of claim 34, wherein the episodic stimulus is applied to the substrate of the transistor.

37. The method of claim 34, wherein the floating gate transistor further comprises a select gate and the episodic stimulus is applied to the select gate.

38. The method of claim 37, wherein the floating gate transistor has dual floating gates, the first control gate being located over the first of the dual floating gates, and further comprises a second control gate over the second of the dual floating gates, wherein the select gate is situated between the two control gates.

39. The method of claim 34, wherein the parameter is the current flowing in a channel region of the floating gate transistor.

40. The method of claim 34, wherein the parameter is a voltage required to established a predetermined current.

41. The method of claim 34, wherein the read interval comprises a first phase and a subsequent second phase, wherein the measuring a parameter is performed during the second phase and applying a set of sense voltage waveforms beginning during the first phase.

42. The method of claim 41, wherein the episodic stimulus is applied the second phase.

43. The method of claim 41, wherein the episodic stimulus is applied the first phase.

44. The method of claim 29, wherein the episodic stimulus is a voltage having a sinusoidal waveform.

45. The method of claim 29, wherein the episodic stimulus is a voltage having a rectangular wave form.

46. The method of claim 29, wherein the episodic stimulus is a voltage having a trapezoidal wave form.

47. The method of claim 29, wherein the memory storage unit is a magnetic memory cell and the episodic stimulus is a magnetic field.

48. The method of claim 29, wherein the memory storage unit is a molecular transistor memory storage unit.

49. The method of claim 29, wherein the memory storage unit is a single electron transistor memory storage unit.

50. The method of claim 29, wherein the memory storage unit is a nano-transistor memory storage unit.

51. The method of claim 29, wherein said determining the conduction characteristics of the storage unit comprises:

determining a first time the conduction characteristics of the storage unit in response to the set of voltages; and subsequently determining a second time the conduction characteristics of the storage unit in response to the set of voltages, wherein the episodic stimulus component is applied only during said determining a second time.

52. The method of claim 51, wherein said subsequently determining a second time the conduction characteristics of the storage unit is in response to error control coding result.

53. A non-volatile memory, comprising:

a memory storage unit;

a sense amplifier connected to the memory storage unit for determining the state of the memory storage unit in response to a set of read voltages; and drivers connected to the memory storage unit for applying the set of read voltages to the memory storage unit, the set of read voltages comprising:

a sense voltage condition; and an episodic stimulus voltage condition, wherein the episodic stimulus voltage condition is distinct from the sense voltage condition.

54. The memory of claim 53, wherein the sense amplifier operates by sensing a current.

55. The memory of claim 53, wherein the sense amplifier operates by sensing a voltage.

56. The memory of claim 53, wherein the memory storage unit is a floating gate transistor and the sense voltage condition includes applying a voltage to a first control gate of the transistor, wherein the sense amplifier measures a parameter between a first and a second source/drain region of the transistor.

57. The memory of claim 56, wherein the episodic stimulus voltage condition is applied to a control gate of the transistor.

58. The memory of claim 56, wherein the episodic stimulus voltage condition is applied to the substrate of the transistor.

59. The memory of claim 56, wherein the floating gate transistor further comprises a select gate and the episodic stimulus voltage condition is applied to the select gate.

60. The memory of claim 59, wherein the floating gate transistor has dual floating gates, the first control gate being located over a first of the dual floating gates, and further comprises a second control gate over the second of the dual floating gates, wherein the select gate is situated between the two control gates.

61. The memory of claim 56, wherein the parameter is the current flowing in a channel region of the floating gate transistor.

62. The memory of claim 56, wherein the parameter is a voltage required to establish a predetermined current.

63. The memory of claim 53, wherein the episodic stimulus voltage condition is a periodic voltage having a rectangular wave form.

64. The memory of claim 53, wherein the episodic stimulus voltage condition is a periodic voltage having a trapezoidal wave form.

65. The memory of claim 53, further comprising:

an error control code section coupled to the sense amplifier and to the drivers, wherein said drivers apply the episodic stimulus voltage condition in response to a control signal from the error control code section.

66. The method of claim 53, wherein the memory storage unit is a magnetic memory cell and the episodic stimulus is a magnetic field.

67. The method of claim 53, wherein the memory storage unit is a molecular transistor memory storage unit.

68. The method of claim 53, wherein the memory storage unit is a single electron transistor memory storage unit.

69. The method of claim 53, wherein the memory storage unit is a nano-transistor memory storage unit.

70. The memory of claim 53, wherein the non-volatile memory comprises an array of storage units of which said memory storage unit is a member, further comprising:

a booster line connected between one of said drivers and a portion of the array including said memory storage unit whereby said episodic stimulus voltage condition is applied.

* * * * *